(12) United States Patent
Salcedo et al.

(10) Patent No.: US 8,592,860 B2
(45) Date of Patent: Nov. 26, 2013

(54) APPARATUS AND METHOD FOR PROTECTION OF ELECTRONIC CIRCUITS OPERATING UNDER HIGH STRESS CONDITIONS

(75) Inventors: Javier A Salcedo, North Billerica, MA (US); David Hall Whitney, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 157 days.

(21) Appl. No.: 13/025,985

(22) Filed: Feb. 11, 2011

(65) Prior Publication Data

US 2012/0205714 A1   Aug. 16, 2012

(51) Int. Cl.
*H01L 29/68* (2006.01)

(52) U.S. Cl.
USPC .... 257/140; 257/168; 257/173; 257/E29.169; 257/E21.608; 438/133; 438/140

(58) Field of Classification Search
USPC .......... 257/140, 173, E29.169, E21.608, 168; 438/133, 140
See application file for complete search history.

(56) References Cited

U.S. PATENT DOCUMENTS

| | | | |
|---|---|---|---|
| 3,436,667 A | 4/1969 | Kedson | |
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,652,689 A | 7/1997 | Yuan | |
| 5,663,860 A | 9/1997 | Swonger | |
| 5,742,084 A | 4/1998 | Yu | |

(Continued)

FOREIGN PATENT DOCUMENTS

| | | |
|---|---|---|
| DE | 10 2007 040 875 A1 | 3/2009 |
| EP | 0 168 678 A2 | 1/1986 |
| EP | 1 703 560 A2 | 9/2006 |

OTHER PUBLICATIONS

Luh et al. *A Zener-Diode-Activated EDS Protection Circuit for Sub-Micron CMOS Processes*, Circuits and Systems, IEEE International Symposium, May 28-31, 2000, Geneva, Switzerland, 4 pages.

(Continued)

*Primary Examiner* — Thinh T Nguyen
(74) *Attorney, Agent, or Firm* — Knobbe Martens Olson & Bear LLP

(57) ABSTRACT

Apparatus and methods for electronic circuit protection under high stress operating conditions are provided. In one embodiment, an apparatus includes a substrate having a first p-well, a second p-well adjacent the first p-well, and an n-type region separating the first and second p-wells. An n-type active area is over the first p-well and a p-type active area is over the second p-well. The n-type and p-type active areas are electrically connected to a cathode and anode of a high reverse blocking voltage (HRBV) device, respectively. The n-type active area, the first p-well and the n-type region operate as an NPN bipolar transistor and the second p-well, the n-type region, and the first p-well operate as a PNP bipolar transistor. The NPN bipolar transistor defines a relatively low forward trigger voltage of the HRBV device and the PNP bipolar transistor defines a relatively high reverse breakdown voltage of the HRBV device.

27 Claims, 22 Drawing Sheets

(56) References Cited

U.S. PATENT DOCUMENTS

| | | | |
|---|---|---|---|
| 5,781,389 A | 7/1998 | Fukuzako et al. |
| 5,889,644 A | 3/1999 | Schoenfeld et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,404,261 B1 | 6/2002 | Grover et al. |
| 6,512,662 B1 | 1/2003 | Wang |
| 6,590,273 B2 | 7/2003 | Okawa et al. |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 * | 7/2004 | Ker et al. ........ 361/56 |
| 6,768,616 B2 | 7/2004 | Mergens et al. |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,601,991 B2 | 10/2009 | Salcedo et al. |
| 7,714,357 B2 | 5/2010 | Hayashi et al. |
| 7,834,378 B2 | 11/2010 | Ryu et al. |
| 7,969,006 B2 | 6/2011 | Lin et al. |
| 8,044,457 B2 | 10/2011 | Salcedo et al. |
| 8,222,698 B2 | 7/2012 | Salcedo et al. |
| 8,368,116 B2 | 2/2013 | Salcedo et al. |
| 8,432,651 B2 | 4/2013 | Salcedo et al. |
| 2001/0040254 A1 | 11/2001 | Takiguchi |
| 2002/0021538 A1 | 2/2002 | Chen et al. |
| 2002/0122280 A1 * | 9/2002 | Ker et al. ........ 361/56 |
| 2002/0187601 A1 | 12/2002 | Lee et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 * | 2/2009 | Tseng et al. ........ 257/133 |
| 2009/0230426 A1 | 9/2009 | Carpenter et al. |
| 2009/0309128 A1 | 12/2009 | Salcedo et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0293904 A1 | 11/2012 | Salcedo et al. |

OTHER PUBLICATIONS

Salcedo et al., Electrostatic Discharge Protection Framework for Mixed-Signal High Voltage CMOS Applications, IEEE Xplore, downloaded Feb. 23, 2010 at 12:53 EST.

International Search Report of the International Searching Authority in counterpart International Appl. No. PCT/US2012/023170, dated May 24, 2012, 4 pages.

Written Opinion of the International Searching Authority in counterpart International Appl. No. PCT/US2012/023170, dated May 24, 2012, 7 pages.

Anderson et al., *ESD Protection under Wire Bonding Pads*, EOS/ESD Symposium 99-88, pp. 2A.4.1-2A.4.7 (1999).

\* cited by examiner

APPARATUS AND METHOD FOR PROTECTION OF ELECTRONIC CIRCUITS OPERATING UNDER HIGH STRESS CONDITIONS

BACKGROUND

1. Field

Embodiments of the invention relate to electronic systems, and more particularly, to protection circuits for integrated electronic systems.

2. Description of the Related Technology

Certain electronic systems can be exposed to a transient electrical event, or an electrical signal of a relatively short duration having rapidly changing voltage and high power. Transient electrical events can include, for example, electro static discharge (ESD) events arising from the abrupt release of charge from an object or person to an electronic system. Transient electrical events can also include, for example, voltage spikes resulting from delivering a varying current to an inductive load, signals received by way of electromagnetic inductive coupling, or transient electrical events arising from starting a motor, such as a load dump transient electrical event resulting from starting an automotive engine.

Transient electrical events can destroy an integrated circuit (IC) inside an electronic system due to overvoltage conditions and high levels of power dissipation over relatively small areas of the IC. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC from self-heating in the latch-up current path.

Certain integrated circuits, for instance, those used in automotive signal conditioning and sensing applications, are required to tolerate a relatively high level of over-voltage stress as well as false conditions at the input and/or output pins, such as short-to-battery condition. Thus, there is a need to provide an IC with protection from such transient electrical events. Furthermore, there is a need for a protection component providing an asymmetrical current versus voltage characteristics and that is able to safely sustain over-voltage stress and false conditions encountered in the relatively harsh automotive environment applications.

SUMMARY

In one embodiment, an apparatus comprises a semiconductor substrate including a first p-well and a second p-well adjacent the first p-well. The first and second p-wells are separated by an n-type region. A first n-type active area is disposed over the first p-well and is electrically connected to a cathode of a first high reverse blocking voltage (HRBV) device. A first p-type active area is disposed over the second p-well and is electrically connected to an anode of the first HRBV device. The first n-type active area, the first p-well and the n-type region are configured to operate as an emitter, a base, and a collector of a NPN bipolar transistor, respectively, and the second p-well, the n-type region, and the first p-well are configured to operate as an emitter, a base, and a collector of a PNP bipolar transistor, respectively. The NPN bipolar transistor defines a forward trigger voltage of the first HRBV device and the PNP bipolar transistor defines a reverse breakdown voltage of the first HRBV device. The apparatus is configured to provide protection from a transient electrical event.

In another embodiment, a method for providing protection from a transient electrical event includes providing a semiconductor substrate, forming a first p-well in the substrate, forming a second p-well in the substrate adjacent the first p-well such that the first and second p-wells are separated by an n-type region, forming a first n-type active area over the first p-well, and forming a first p-type active area over the second p-well. The first n-type active area is electrically connected to a cathode of a first high reverse blocking voltage (HRBV) device, and the first p-type active area is electrically connected to an anode of the first HRBV device. The first n-type active area, the first p-well and the n-type region are configured to operate as an emitter, a base, and a collector of a NPN bipolar transistor, respectively, and the second p-well, the n-type region, and the first p-well are configured to operate as an emitter, a base, and a collector of a PNP bipolar transistor, respectively. The NPN bipolar transistor defines a forward trigger voltage of the first HRBV device and the PNP bipolar transistor defines a reverse breakdown voltage of the first HRBV device.

In another embodiment, an apparatus includes a semiconductor substrate having a first well and a second well adjacent the first well. The first and second wells have a doping of a first type and are separated by a doped region having a doping of a second type opposite the first. A first active area is over the first well, and has a doping of the second type. The first active area is electrically connected to a first terminal of a first high reverse blocking voltage (HRBV) device. A second active area is over the second well, and has a doping of the first type. The second active area is electrically connected to a second terminal of the first HRBV device. The first active area, the first well and the doped region are configured to operate as an emitter, a base, and a collector of a first bipolar transistor, respectively, and the second well, the doped region, and the first well are configured to operate as an emitter, a base, and a collector of a second bipolar transistor, respectively. The first bipolar transistor defines a forward trigger voltage of the first HRBV device and the second bipolar transistor defines a reverse breakdown voltage of the first HRBV device. The apparatus is configured to provide protection from a transient electrical event.

In another embodiment, a method for providing protection from a transient electrical event includes providing a semiconductor substrate, forming a first well in the substrate, and forming a second well in the substrate adjacent the first well such that the first and second wells are separated by a doped region. The first and second wells have a doping of a first type, and the doped region has a doping of a second type opposite the first. The method further includes forming a first active area over the first well, the first active area having a doping of the second type and electrically connected to a first terminal of a first high reverse blocking voltage (HRBV) device. The method further includes forming a second active area over the second well, the second active area having a doping of the first type and electrically connected to a second terminal of the first HRBV device. The first active area, the first well and the doped region are configured to operate as an emitter, a base, and a collector of a first bipolar transistor, respectively, and the second well, the doped region, and the first well are configured to operate as an emitter, a base, and a collector of a second bipolar transistor, respectively. The first bipolar transistor defines a forward trigger voltage of the first HRBV device and the second bipolar transistor defines a reverse breakdown voltage of the first HRBV device.

DETAILED DESCRIPTION OF EMBODIMENTS

Figure 1:
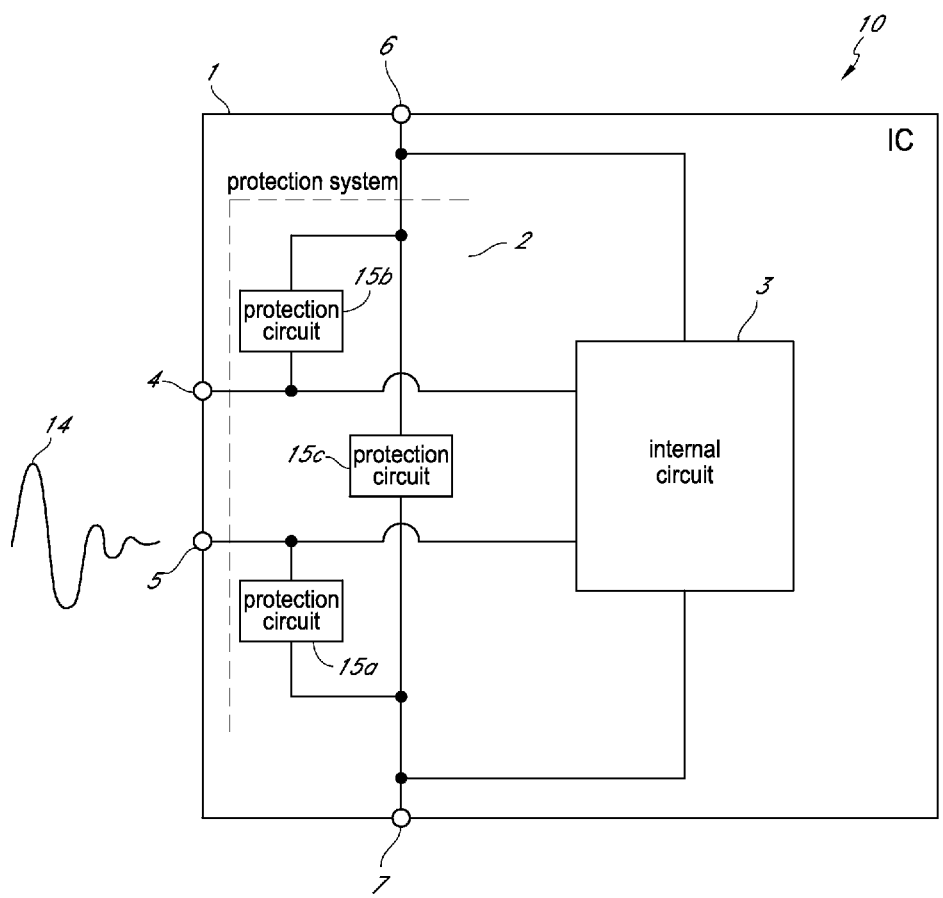
FIG. 1 is a schematic block diagram of one example of an electronic system including an integrated circuit (IC) and a protection system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Certain electronic systems are configured to protect circuits or components therein from transient electrical events. Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events as discussed above, including ESD events.

Electronic circuit reliability can be improved by providing pad protection circuits to the pads of an IC. Such a pad protection circuit can also be generally referred to as an "IC protection circuit" in this document. The pad protection circuits can maintain the voltage level at the pad within a predefined safe range.

In certain applications, it can be desirable for a pad protection circuit to exhibit bidirectional operation such that a pad protection circuit transitions from a high-impedance state to a low-impedance state when the voltage of the transient electrical event exceeds a forward trigger voltage in the positive direction or falls below a reverse trigger voltage in the negative direction. The pad protection circuit can be configured to shunt a portion of the current associated with the transient electrical event when in the low-impedance state, so as to prevent the voltage of a transient electrical event from either reaching a forward or reverse failure voltage associated with damage to the IC. As will be described in detail later with reference to FIG. 2, for transient electrical events having a positive voltage, the pad protection circuit can remain in the low-impedance state as long as the transient electrical event voltage remains above a forward holding voltage. Likewise, for negative transient signal events, the pad protection circuit can remain the low-impedance state as long as the transient electrical event voltage remains below a reverse holding voltage.

There is a need for a pad protection circuit that can be used to provide transient electrical event protection against both negative and positive transient signals, and that can have fast operational performance, low static power dissipation, and a small circuit area. Furthermore, there is a need for a pad protection circuit that can provide asymmetrical bidirectional transient electrical event protection. For example, these characteristics can be desirable in ICs to be used in certain automotive, medical, and industrial processes having a zero defect target and required to pass harsh test conditions such as an input and/or output short-to-battery condition, so as to minimize the risk to human health or lives which could result from IC failure.

Overview of Electronic Systems with a Protection System

FIG. 1 is a schematic block diagram of an electronic system 10, which can include one or more pad protection circuits according to some embodiments. The illustrated electronic system 10 includes an integrated circuit (IC) 1 that includes a protection system 2, an internal circuit 3, and pins or pads 4-7. The internal circuit 3 can be electrically connected to one or more of the pads 4-7. Each of the pads 4-7 can be, for example, one of power pads, ground pads, input pads, output pads, or bidirectional pads.

The IC 1 can be exposed to transient electrical events, such as ESD events, which can cause IC damage and induce latch-up. For example, the pad 5 can receive a transient electrical event 14, which can travel along electrical connections of the IC 1 and reach the internal circuit 3. The transient electrical event 14 can produce overvoltage conditions and can dissipate high levels of power, which can disrupt the functioning of the internal circuit 3 and potentially cause permanent damage.

In some embodiments, a protection system 2 can be provided to ensure reliability of the IC 1 by maintaining the voltage level at the pads of the IC 1 within a particular range of voltage, which can vary from pad to pad. The protection system 2 can include one or more pad protection circuits, such as the pad protection circuits 15a-15c. The pad protection circuits 15a-15c can be configured to divert a current associated with a transient electrical event received on a pad of the IC to other nodes or pads of the IC, thereby providing transient electrical event protection, as will be described in further detail below.

Pad protection circuits can be placed, for example, between a power pad and an input pad, between a power pad and an output pad, between a power pad and a bidirectional pad, between a ground pad and an input pad, between a ground pad and an output pad, between a ground pad and a bidirectional pad, and/or between a power pad and a ground pad. When no transient electrical event is present, the pad protection circuit can remain in a high-impedance/low-leakage state, thereby reducing static power dissipation resulting from leakage current.

The protection system 2 can be integrated on-chip with the IC 1. However, in other embodiments, the protection system 2 can be arranged in a separate IC. For example, the protection system 2 can be included in a separately packaged IC, or it can be encapsulated in a common package with the IC 1. In such embodiments, one or more pad protection circuits can be placed in a stand-alone IC, in a common package for system-on-a-package applications, or integrated with an IC in a common semiconductor substrate for system-on-a-chip applications.

The IC 1 can be used in, for example, video amplifier systems for automotive infotainment, transmission line systems, industrial control systems, power management systems, microelectromechanical system (MEMS) sensors, transducers, automotive local interconnect network (LIN) and controller interface network (CAN) interface systems, or a variety of other systems. The IC 1 can be utilized in electronic systems in which the pins of the IC are exposed to user contact through a low-impedance connection.

Pad Protection Circuits

Figure 2:
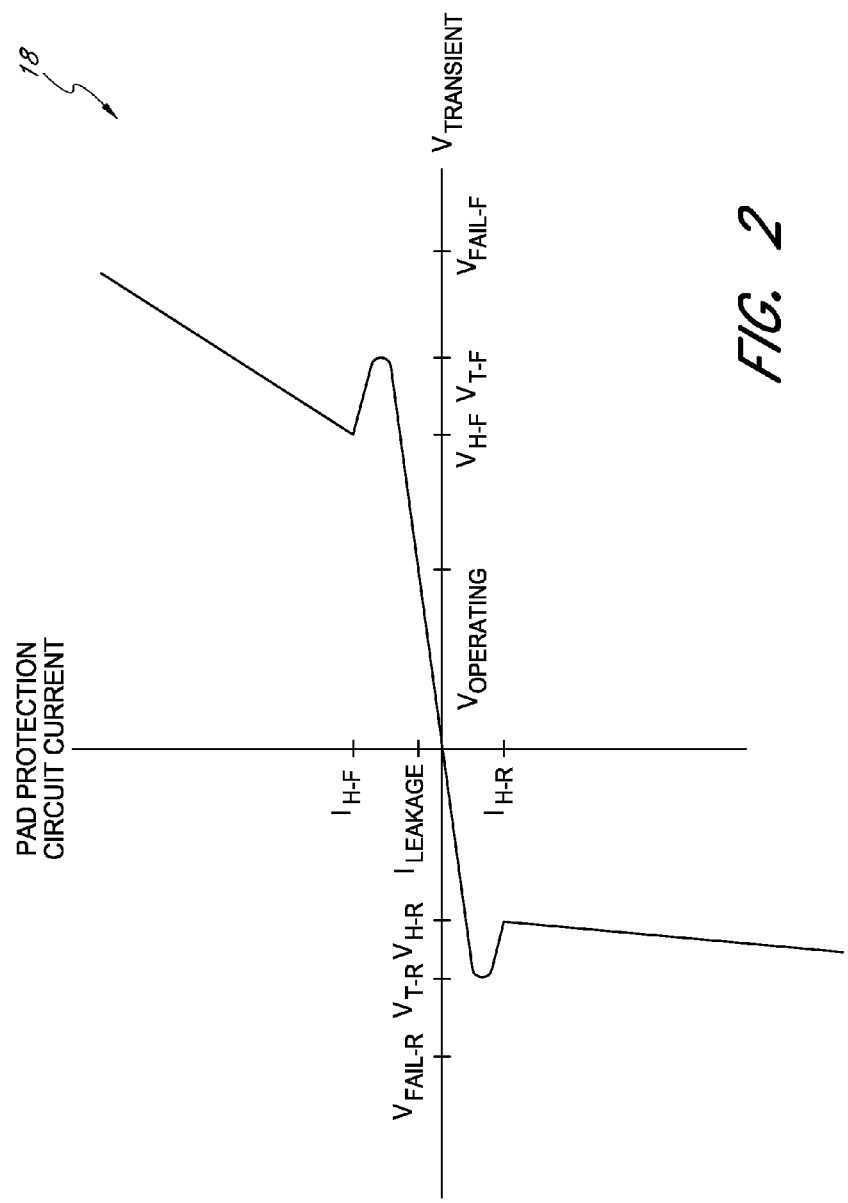
FIG. 2 is a graph of IC protection circuit current versus transient electrical event voltage in accordance with one embodiment.

FIG. 2 is a graph 18 of IC protection circuit current versus transient electrical event voltage in accordance with one embodiment. As described above, a pad protection circuit can be configured to maintain the voltage level at a pad within a predefined safe range. Thus, for transient electrical events having a positive voltage, the pad protection circuit can shunt a large portion of the current associated with the transient signal event before the voltage of the transient signal $V_{TRANSIENT}$ reaches a forward failure voltage $V_{FAIL-F}$ that could otherwise cause damage to the IC 1. Additionally, for transient electrical events having a negative voltage, the pad protection circuit can shunt a large portion of the current associated with the transient signal event before the voltage of the transient signal $V_{TRANSIENT}$ falls below a reverse failure voltage $V_{FAIL-R}$ that could otherwise cause damage to the IC 1. Furthermore, it can be desirable that the pad protection circuit conduct a relatively low current at the normal operating voltage $V_{OPERATING}$, thereby reducing or minimizing static power dissipation resulting from the leakage current $I_{LEAKAGE}$ and enhancing the energy efficiency of the IC using the pad protection circuit.

As shown in the graph 18, for transient electrical events having a positive voltage, the pad protection circuit can transition from a high-impedance state to a low-impedance state when the voltage of the transient signal $V_{TRANSIENT}$ reaches the forward trigger voltage $V_{T-F}$. Thereafter, the pad protection circuit can shunt a large current over a wide range of transient electrical event voltage levels. The pad protection circuit can remain in the low-impedance state as long as the transient signal voltage level remains above a preselected forward holding voltage $V_{H-F}$.

The pad protection circuit can also shunt a large current for transient electrical events having a negative voltage, so that the protection circuit can provide bidirectional transient electrical event protection by providing a protection current for transient electrical events having positive and/or negative voltage signal levels. Thus, the pad protection circuit can provide a current path when the voltage of the transient signal $V_{TRANSIENT}$ reaches the reverse trigger voltage $V_{T-R}$. Thereafter, the pad protection circuit can shunt a large current over a wide range of transient electrical event voltage levels. The pad protection circuit can remain in the low-impedance state as long as the voltage of the transient signal is below the holding voltage $V_{H-R}$ such that the transient signal is able to deliver the energy sufficient to keep the pad protection circuit activated in the low-impedance state.

By configuring the pad protection circuit to have a forward trigger voltage $V_{T-F}$, a forward holding voltage $V_{H-F}$, a reverse trigger voltage $V_{T-F}$, a reverse holding voltage $V_{H-R}$, and a reverse trigger voltage $V_{T-R}$, the pad protection circuit can exhibit bidirectional operation, while having enhanced stability against unintended activation and/or improved performance per unit area. Additionally, as illustrated in FIG. 2, the pad protection circuit can exhibit asymmetric operation against transient electrical events of opposite polarities.

As will be described herein, pad protection circuits are provided having bidirectional operation in which the forward trigger, forward holding, reverse trigger, and reverse holding voltages can be independently selected to achieve a desired pad protection circuit protection response.

Figure 3:
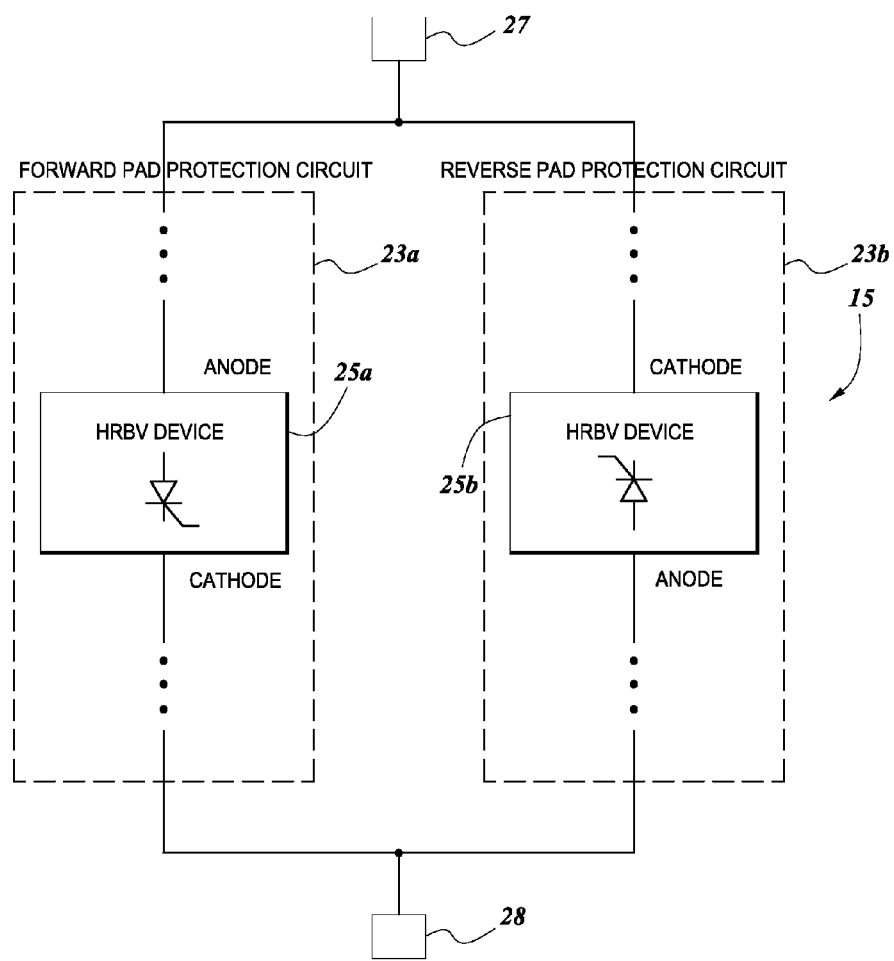
FIG. 3 is a schematic block diagram of a pad protection circuit in accordance with one embodiment.

FIG. 3 is a schematic block diagram of a pad protection circuit 15 in accordance with one embodiment. The pad protection circuit 15 includes a forward pad protection circuit 23a and a reverse pad protection circuit 23b, each of which is electrically connected between a pad 27 and a node 28. The pad 27 can be a pad of an integrated circuit, such as the pad 4 of FIG. 1. The node 28 can be, for example, a low impedance node or pad of the integrated circuit configured to handle a relatively large shunted current.

The forward and reverse pad protection circuits 23a, 23b can be used to protect the pad 27 against positive and negative transient electrical events, respectively. The forward pad protection circuit 23a includes a first high reverse blocking voltage (HRBV) device 25a, and the reverse pad protection circuit 23b includes a second HRBV device 25b.

The first and second HRBV devices 25a, 25b each include an anode and a cathode. The anode of the HRBV device 25a is electrically connected to the pad 27, and the cathode of the HRBV device 25a is electrically connected to the node 28. In contrast, the anode of the HRBV device 25b is electrically connected to the node 28, and the cathode of the HRBV device 25b is electrically connected to the pad 27.

The first and second HRBV devices 25a, 25b can each have relatively large reverse breakdown voltages and relatively low forward trigger voltages, which can aid in providing asymmetrical bidirectional transient electrical event protection to the pad 27. For example, the forward pad protection circuit 23a can include the first HRBV device 25a alone or in combination with one or more other pad protection devices electrically connected end-to-end in series with first HRBV device 25a to aid in tuning the forward response. Since the first HRBV device 25a can have a relatively low forward trigger voltage, the forward pad protection circuit 23a can include a cascade of devices tuned to achieve the desired forward protection performance, including a particular desired forward holding voltage $V_{H\text{-}F}$ and forward trigger voltage $V_{T\text{-}F}$. Furthermore, since the first HRBV device 25a can have a relatively large reverse breakdown voltage, the inclusion of the first HRBV device 25a in the cascade can prevent the forward pad protection circuit 23a from activating for a transient signal event having a negative signal voltage, thereby permitting reverse protection to be provided by a separate circuit.

Similarly, the reverse pad protection circuit 23b can include the second HRBV device 25b, alone or in combination with one or more other pad protection devices electrically connected end-to-end in a cascade to achieve a desired reverse response. The relatively low forward trigger voltage of the second HRBV device 25b can permit the tuning of a desired reverse holding voltage $V_{H\text{-}R}$ and reverse trigger voltage $V_{T\text{-}R}$ of the circuit, while the relatively high reverse breakdown voltage of the second HRBV device 25b can aid in preventing unintentional activation of the reverse pad protection circuit 23b for a transient signal event having a positive signal voltage. Thus, inclusion of the first and second HRBV devices 25a, 25b can aid in permitting the forward and reverse pad protections circuits 23a, 23b to be separately tuned, thereby achieving a pad protection circuit response that is desirable for a particular application, including, for example, emerging automotive infotainment applications.

Although FIG. 3 illustrates a case where an HRBV device has been included in each of the forward and reverse pad protection circuits 23a, 23b, in certain embodiments, the HRBV devices need not be included in both the forward and reverse pad protection circuits. For example, in implementations in which the desired reverse holding and trigger voltages are relatively low and a high reverse breakdown voltage is not needed for the forward pad protection circuit, an HRBV device can be omitted from the forward pad protection circuit. Similarly, when the desired forward holding and trigger voltages are relatively low and a high reverse breakdown voltage is not needed in the reverse pad protection circuit, an HRBV device can be omitted the reverse pad protection circuit 23b.

Figure 4A:
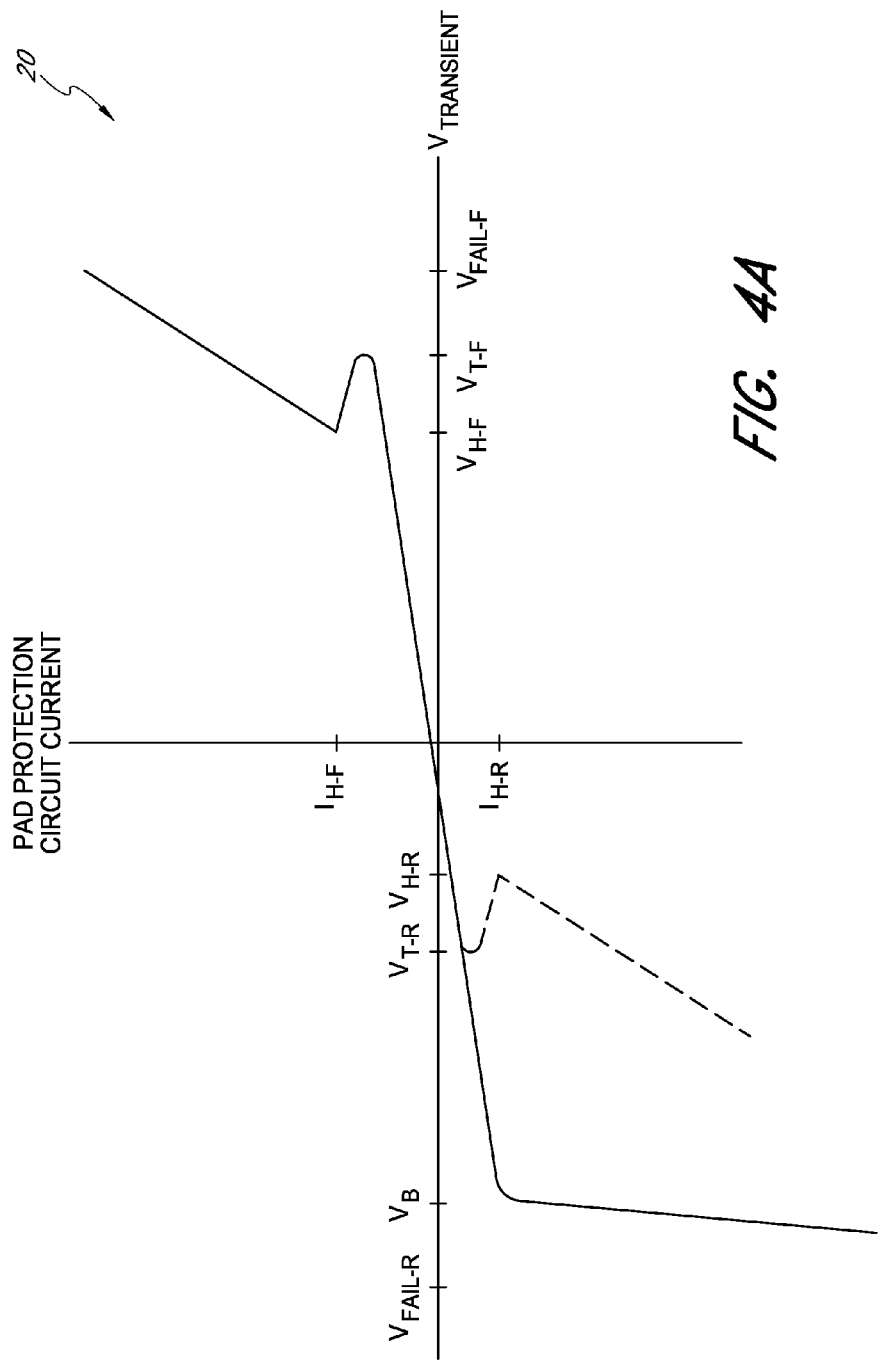
FIG. 4A is a graph of IC protection circuit current versus transient electrical event voltage in accordance with another embodiment.

FIG. 4A is a graph 20 of IC protection circuit current versus transient electrical event voltage in accordance with another embodiment. The graph 20 illustrates in a solid line an example of a pad protection current for a forward pad protection circuit having an HRBV device, such as the first HRBV device 25a of FIG. 3. As illustrated in the graph 20, the reverse breakdown voltage $V_B$ of the pad protection circuit can have a magnitude that is substantially greater than the target reverse trigger voltage $V_{T\text{-}R}$ and the reverse holding voltage $V_{H\text{-}R}$. Accordingly, inclusion of the HRBV device permits protection from transient electrical events having a negative signal voltage to be provided by a separate circuit, for instance, the current-voltage characteristics shown as a dashed line in the plot.

Figure 4B:
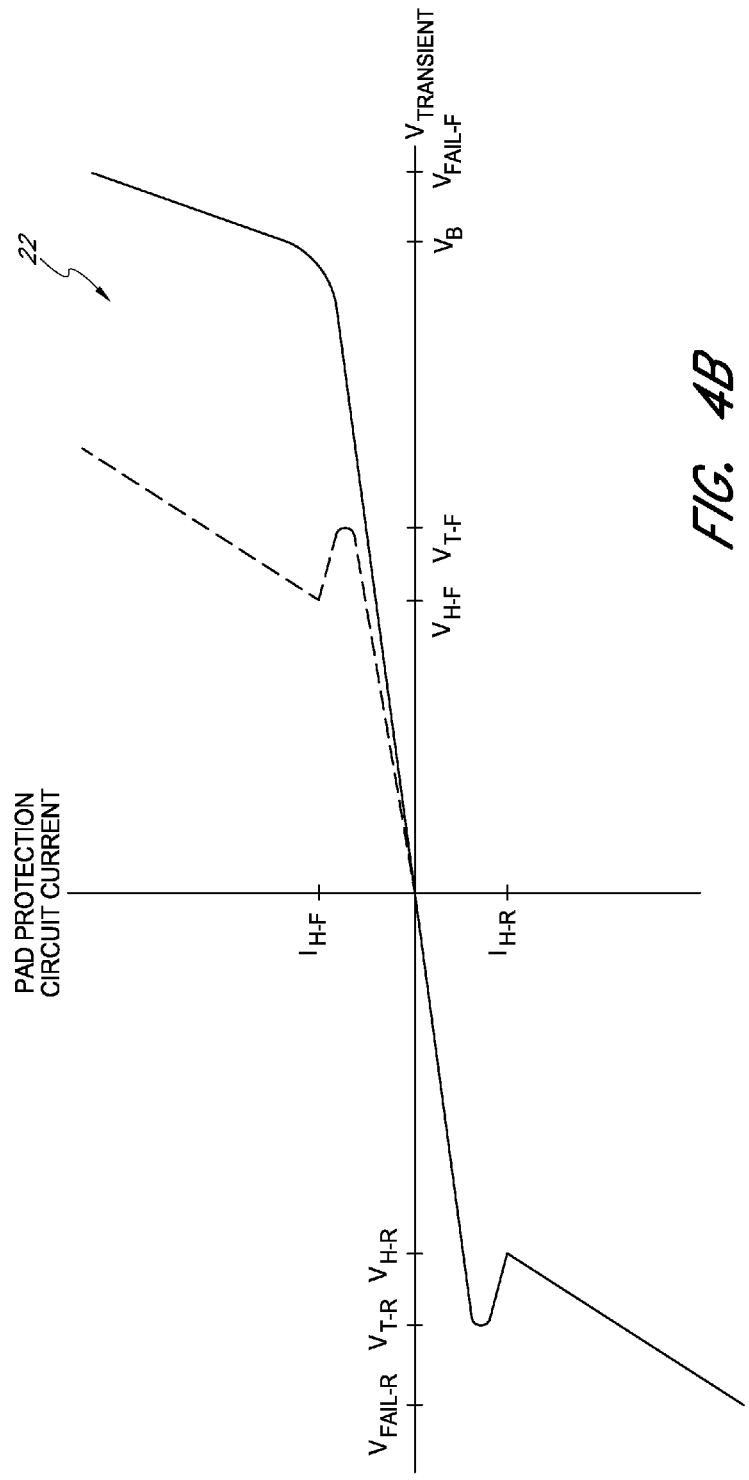
FIG. 4B is a graph of IC protection circuit current versus transient electrical event voltage in accordance with yet another embodiment.

FIG. 4B is a graph of IC protection circuit current versus transient electrical event voltage in accordance with yet another embodiment. The graph 22 illustrates in a solid line an example of a pad protection current for a reverse pad protection circuit having an HRBV device, such as the second HRBV device 25b of FIG. 3. As illustrated in the graph 22, the breakdown voltage $V_B$ on the positive-side of the pad protection circuit can have a relatively large magnitude that is greater than the target forward trigger voltage $V_{T\text{-}F}$ and the forward holding voltage $V_{H\text{-}F}$. Accordingly, inclusion of the HRBV device permits protection from transient electrical events having a positive signal voltage to be provided by a separate circuit, for instance, the current-voltage characteristics shown as a dashed line in the plot, such as a circuit having the current versus voltage response illustrated in FIG. 4A.

The forward and reverse pad protections circuits corresponding to the graphs 20, 22 can be electrically connected in parallel to provide an effective pad protection circuit having a current versus voltage response similar to that shown in FIG. 2. Inclusion of a reverse pad protection circuit that can withstand a large positive transient electrical event without breakdown permits the pad protection circuit to have a forward trigger voltage $V_{T\text{-}F}$ and a forward holding voltage $V_{H\text{-}F}$ determined by the forward pad protection circuit. Likewise, inclusion of a forward pad protection circuit that can withstand a large negative transient electrical event without breakdown permits the pad protection circuit to have a reverse trigger voltage $V_{T\text{-}R}$ and a reverse holding voltage $V_{H\text{-}R}$ determined by the reverse pad protection circuit.

As will be described herein, HRBV devices having a relatively large breakdown voltage and relatively low forward trigger voltage are provided. The HRBV devices can be used alone or in combination with other pad protection circuits to achieve a desired holding and trigger voltage for each of a forward and a reverse direction. The HRBV devices have a relatively high reverse breakdown voltage, thereby permitting the forward and reverse pad protection circuits to be separately tuned to achieve an overall desired pad protection circuit response. Thus, including HRBV devices in a forward protection circuit and/or a reverse protection circuit can permit the positive and negative I-V characteristics of the pad protection circuit to be independently determined without interacting with each other due to unintended parasitic device conduction paths.

Figure 5:
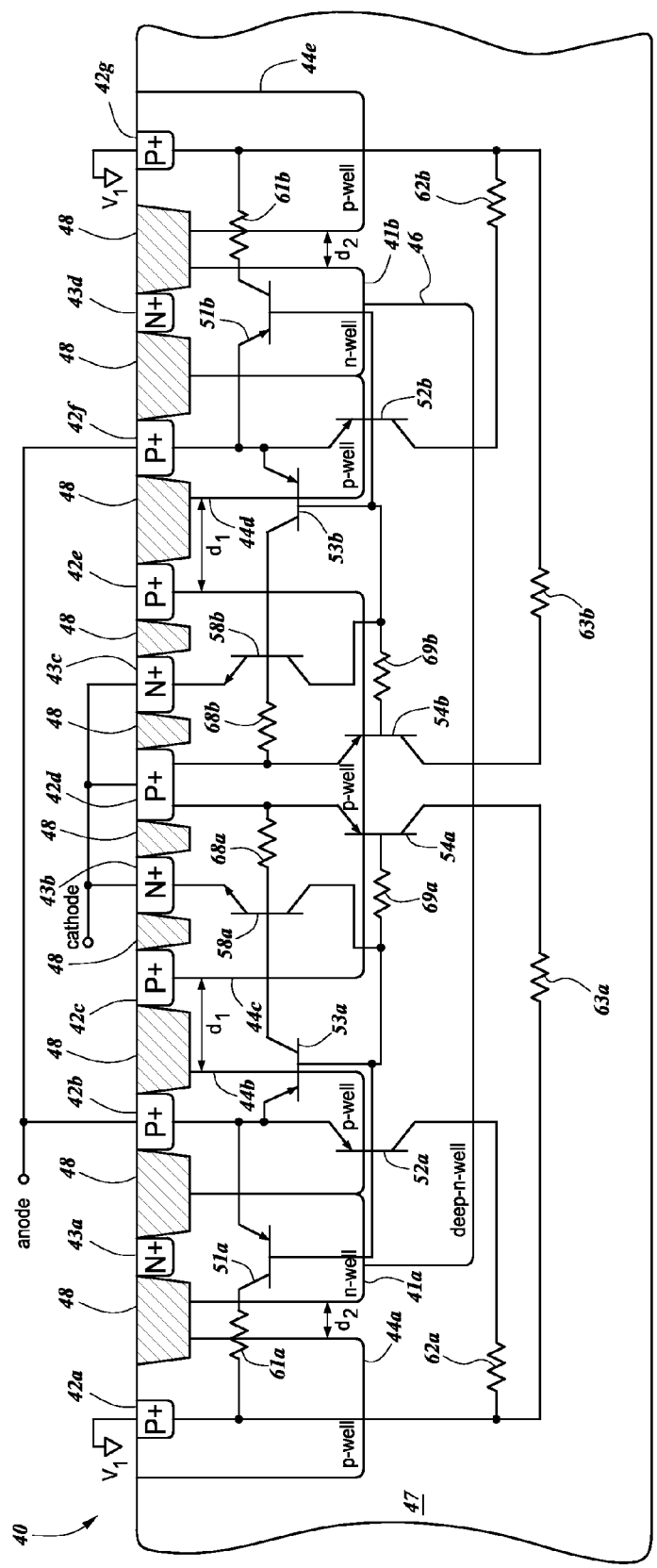
FIG. 5 is an annotated cross section of one embodiment of a high reverse blocking voltage (HRBV) device.
Figure 6:
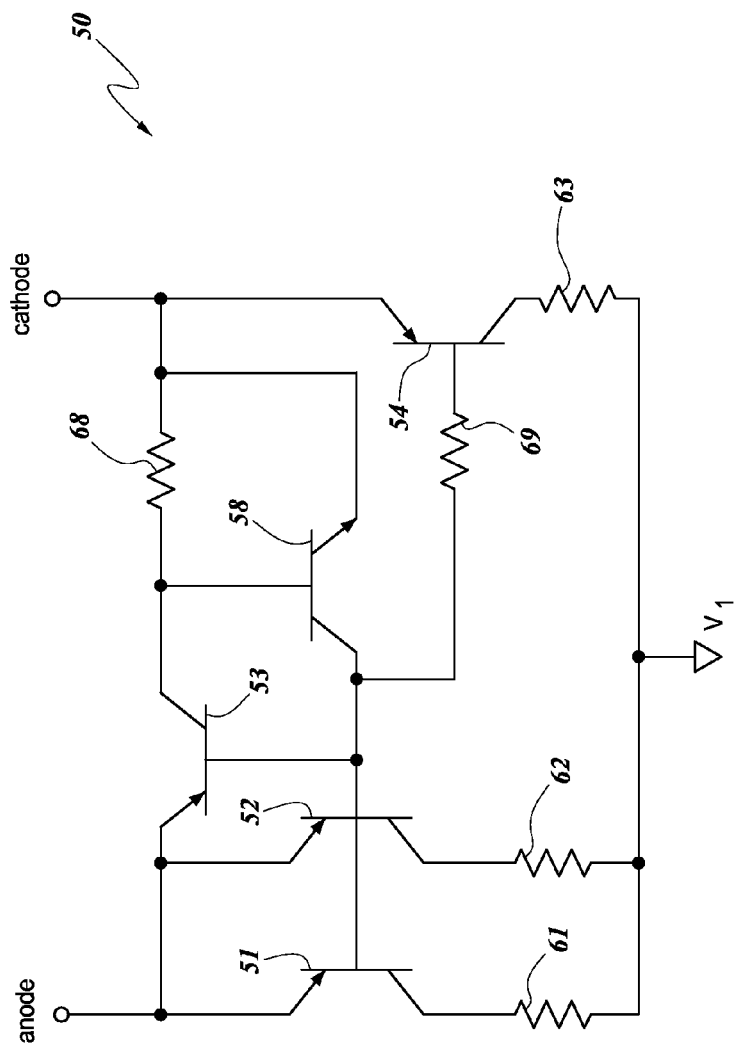
FIG. 6 is an equivalent circuit diagram of the HRBV device of FIG. 5.

FIG. 5 is an annotated cross section of one embodiment of an HRBV device 40. FIG. 6 is an equivalent circuit diagram of the HRBV device 40 of FIG. 5.

The annotated cross section of the HRBV device 40 includes a p-type substrate 47, n-type active areas 43a-43d, p-type active areas 42a-42g, n-wells 41a, 41b, p-wells 44a-44e, deep n-well 46, and isolation regions 48. The cross section has been annotated to show certain circuit devices formed from the layout, such as first PNP bipolar transistors 51a, 51b, second PNP bipolar transistors 52a, 52b, third PNP bipolar transistors 53a, 53b, fourth PNP bipolar transistors 54a, 54b, NPN bipolar transistors 58a, 58b, first resistors 61a, 61b, second resistors 62a, 62b, third resistors 63a, 63b, fourth resistors 68a, 68b, and fifth resistors 69a, 69b. The illustrated HRBV device can undergo back end processing to form contacts and metallization. Skilled artisans will appreciate that these details have been omitted from this figure for clarity.

The first PNP bipolar transistors 51a, 51b can be formed from the p-wells 44b, 44d, n-wells 41a, 41b and the substrate 47, and can be lateral parasitic PNP devices. The first PNP bipolar transistor 51a can have an emitter formed from the p-well 44b, a base formed from the n-well 41a, and a collector formed from the substrate 47. Similarly, the first PNP bipolar transistor 51b can have an emitter formed from the p-well 44d, a base formed from the n-well 41b, and a collector formed from the substrate 47. The second PNP bipolar transistors 52a, 52b can be formed from the p-wells 44b, 44d, the deep n-well 46, and the substrate 47, and can be vertical parasitic PNP devices. The second PNP bipolar transistor 52a can have an emitter formed from the p-well 44b, a base formed from the deep n-well 46, and a collector formed from the substrate 47. Similarly, the second PNP bipolar transistor 52b can have an emitter formed from the p-well 44d, a base formed from the deep n-well 46, and a collector formed from the substrate 47.

The third PNP bipolar transistors 53a, 53b can be formed from the p-wells 44b-44d and the deep n-well 46, and can be lateral parasitic PNP devices. For example, the third PNP bipolar transistor 53a can have an emitter formed from the p-well 44b, a base formed from the deep n-well 46, and a collector formed from the p-well 44c. Similarly, the third PNP bipolar transistor 53b can have an emitter formed from the p-well 44d, a base formed from the deep n-well 46, and a collector formed from the p-well 44c. The fourth PNP bipolar transistors 54a, 54b can be formed from the p-well 44c, deep n-well 46, and the substrate 47, and can be vertical parasitic PNP devices. The fourth PNP bipolar transistors 54a, 54b can each have an emitter formed from the p-well 44c, a base formed from the deep n-well 46, and a collector formed from the substrate 47.

The NPN bipolar transistors 58a, 58b can be formed from the n-type active areas 43b, 43c, the p-well 44c, and the deep n-well 46, and can be lateral parasitic NPN devices. For example, the NPN bipolar transistor 58a can have an emitter formed from the n-type active area 43b, a base formed from the p-well 44c, and a collector formed from the deep n-well 46. Likewise, the NPN bipolar transistor 58b can have an emitter formed from the n-type active area 43c, a base formed from the p-well 44c, and a collector formed from the deep n-well 46.

The first resistors 61a, 61b can be formed from the resistance between the collectors of the first PNP bipolar transistors 51a, 51b and the p-type active areas 42a, 42g. For example, the resistance along the paths between the collectors of the lateral PNP bipolar transistors 51a, 51b and p-type active areas 42a, 42g can be modeled by the first resistors 61a, 61b. Similarly, the second resistors 62a, 62b can be formed from the resistance between the collectors of the second PNP bipolar transistors 52a, 52b and the p-type active areas 42a, 42g and the third resistors 63a, 63b can be formed from the resistance between the collectors of the fourth PNP bipolar transistors 54a, 54b and the p-type active areas 42a, 42g. Additionally, the fourth resistors 68a, 68b can be formed from the resistance between the bases of the NPN bipolar transistors 58a, 58b and the p-type active area 42d. Furthermore, the fifth resistors 69a, 69b can be formed from the resistance between the bases of the PNP bipolar transistors 51a, 51b and the deep n-well 46.

The p-type active areas 42a, 42g and the p-wells 44a, 44e can form a guard ring around the HRBV device 40. The guard ring can be employed to eliminate the formation of unintended parasitic paths between the HRBV device 40 and surrounding semiconductor components when integrated on-chip. Additionally, the p-type active areas 42a, 42g and the p-wells 44a, 44e can further aid in collecting mobile charges from the substrate and eliminating the formation of unintended parasitic paths, thereby protecting the HRBV device 40 from latch-up, such as latch-up to a core circuit well and/or to another well of associated with a pad.

The p-wells 44b-44d can be electrically isolated from the substrate 47 using the n-wells 41a, 41b and the deep n-well 46. Electrically isolating the p-wells 44b-44d permits the p-wells to operate as emitters, bases, or collectors for the illustrated bipolar devices. As used herein, and as will be understood by one of skill in the art, the term "deep n-well" refers to any suitable n-type buried layer, including, for example, those used in silicon-on-insulator (SOI) technologies.

The isolation regions 48 can reduce static current leakage between active areas connected to different electrical nodes. Formation of the isolation regions 48 can involve etching trenches in the substrate 47, filling the trenches with a dielectric, such as silicon dioxide, and removing the excess dielectric using any suitable method, such as chemical-mechanical planarization. Although the isolation regions 48 are illustrated as shallow trench isolation regions, the isolations regions 48 can be any suitable isolation region, including, for example, deep trench or local oxidation of silicon (LOCOS) regions.

Persons having ordinary skill in the art will appreciate that the cross section shown in FIG. 5 can correspond to the equivalent circuit shown in FIG. 6. For example, the first PNP bipolar transistors 51a, 51b can be represented by a first PNP bipolar transistor 51, the second PNP bipolar transistors 52a, 52b can be represented by a second PNP bipolar transistor 52, the third PNP bipolar transistors 53a, 53b can be represented by a third PNP bipolar transistor 53, and the fourth PNP bipolar transistors 54a, 54b can be represented by a fourth PNP bipolar transistor 54. Similarly, the NPN bipolar transistors 58a, 58b can be represented by an NPN bipolar transistor 58, the first resistors 61a, 61b can be represented by a first resistor 61, the second resistors 62a, 62b can be represented by a second resistor 62, the third resistors 63a, 63b can be represented by a third resistor 63, the fourth resistors 68a, 68b can be represented by a fourth resistor 68, and the fifth resistors 69a, 69b can be represented by a fifth resistor 69.

With reference to FIG. 6, the emitter of the first PNP bipolar transistor 51 is electrically connected to the emitters of the second and third PNP bipolar transistors 52, 53 at a node labeled anode. The base of the first PNP bipolar transistor 51 is electrically connected to collector of the NPN bipolar transistor 58, to a first end of the fifth resistor 69, and to the bases of the second and third PNP bipolar transistors 52, 53. The collector of the first PNP bipolar transistor 51 is electrically connected to a first end of the first resistor 61. The first resistor 61 further includes a second end electrically connected to a voltage reference $V_1$, which can be any suitable low impedance node, such as a ground node or a negative voltage supply. The collector of second PNP bipolar transistor 52 is electrically connected to a first end of the second resistor 62. The second resistor 62 further includes a second end electrically connected to the voltage reference $V_1$.

The base of the NPN bipolar transistor 58 is electrically connected to the collector of the third PNP bipolar transistor 53 and to a first end of the fourth resistor 68. The emitter of the NPN bipolar transistor 58 is electrically connected to a second end of the fourth resistor 68 and to the emitter of the fourth PNP bipolar transistor 54 at a node labeled cathode. The base of the fourth PNP bipolar transistor 54 is electrically connected to a second end of the fifth resistor 69. The collector of the fourth PNP bipolar transistor 54 is electrically connected to a first end of the third resistor 63. The third resistor 63 further includes a second end electrically connected to the voltage reference $V_1$.

The HRBV device 50 can protect an IC from a transient electrical event that causes the voltage of the anode to increase relative to the voltage of the cathode. The emitter-base junctions of the PNP bipolar transistors 51-53 can provide a voltage equal to about the anode voltage to the collector of the NPN bipolar transistor 58. During a transient electrical event that increases the voltage of the anode, the voltage at the collector of the NPN bipolar transistor 58 can increase until the collector-emitter breakdown voltage of NPN bipolar transistor 58 is reached. The breakdown of the collector-emitter of the NPN bipolar transistor 58 can stimulate a flow of current through the PNP bipolar transistor 53, a portion of which can flow through the fourth resistor 68. As the voltage across the fourth resistor 68 increases, the base-emitter junction of the NPN bipolar transistor 58 can become forward-biased, thereby stimulating an amplified flow of current through the NPN bipolar transistor 58 and transitioning the HRBV device 50 into a low-impedance dual-carrier injection regenerative state defining the forward trigger voltage of the device.

Since the forward trigger voltage of the HRBV device 50 in the forward direction can be relatively low, the HRBV device 50 can be referred to as a low forward trigger voltage (LFTV) or HRBV-LFTV device. The distance $d_1$ between the p-well 44c and the p-wells 44b, 44d can define a width of the base of the NPN bipolar transistor 58, and can be used to tune the forward trigger voltage of the HRBV device 50. In one implementation, the distance $d_1$ is selected to be in the range of about 1.5 μm to about 6.5 μm, for example, about 4.5 μm.

To aid in preventing other junctions defining the forward trigger voltage of the HRBV device 50, such as junctions associated with the lateral and vertical parasitic PNP transistors 51, 52, 54, the first resistor 61, the second resistor 62 and the third resistor 63 can have a magnitude selected to be relatively large.

With continuing reference to FIG. 5, in certain embodiments, the distance $d_2$ between the p-well 44a and n-well 41a and between the p-well 44e and the n-well 41b is selected to avoid breakdown of the first PNP bipolar transistor 51, the second PNP bipolar transistor 52 and/or the fourth PNP bipolar transistor 54 at a voltage below that of the breakdown voltage of the NPN bipolar transistor 58. In one implementation, the distance $d_2$ is selected to be in the range of about 0.5 μm to about 2.5 μm, for example, about 2 μm.

The HRBV device shown in FIGS. 5-6 can withstand a relatively large voltage between the cathode and anode while maintaining a relatively low leakage. For example, in certain implementations, the HRBV device 40 can have a leakage current of less than about 40 pA for a reverse voltage of about 40 V. The relatively high reverse breakdown voltage can be determined based upon a breakdown between the deep n-well 46 and each of the p-wells 44b, 44d. Since the p-wells 44b, 44d and the deep n-well 46 can be relatively lightly doped, junction breakdown can occur at a relatively high voltage. For example, the junction formed between the p-wells 44b, 44d and the deep n-well 46 can be amongst the highest voltage blocking junctions in certain advanced CMOS, high voltage CMOS, and BCDMOS processes.

As described above, the HRBV device 40 can have a relatively high reverse blocking voltage and a relatively low forward trigger voltage. Thus, when protecting a pad using a forward pad protection circuit and a reverse pad protection circuit to protect against positive and negative transient electrical events, respectively, the forward pad protection circuit can include a first HRBV device having an anode electrically connected to the pad and the reverse pad protection circuit can include a second HRBV device having a cathode electrically connected to the pad. Since the first HRBV device can have a relatively low forward trigger voltage, the first HRBV device can be used in the forward protection circuit alone or in combination with other protection elements to achieve a desired forward protection response. Additionally, since the first HRBV device can have a relatively large reverse blocking voltage and can withstand a large negative transient electrical event at the pad without breakdown, the first HRBV device can be used to prevent the forward protection circuit from activating for negative transient electrical events. Similarly, the second HRBV device can be used in the reverse protection circuit alone or in combination with other protection elements to achieve a desired reverse protection response, and can be used to prevent the reverse protection circuit from activating for positive transient electrical events.

Thus, an HRBV device can be included in each of the forward and/or reverse protection circuits to aid in separately tuning the forward and reverse protection responses, thereby achieving a pad protection circuit response that is desirable for a particular application.

Figure 7:
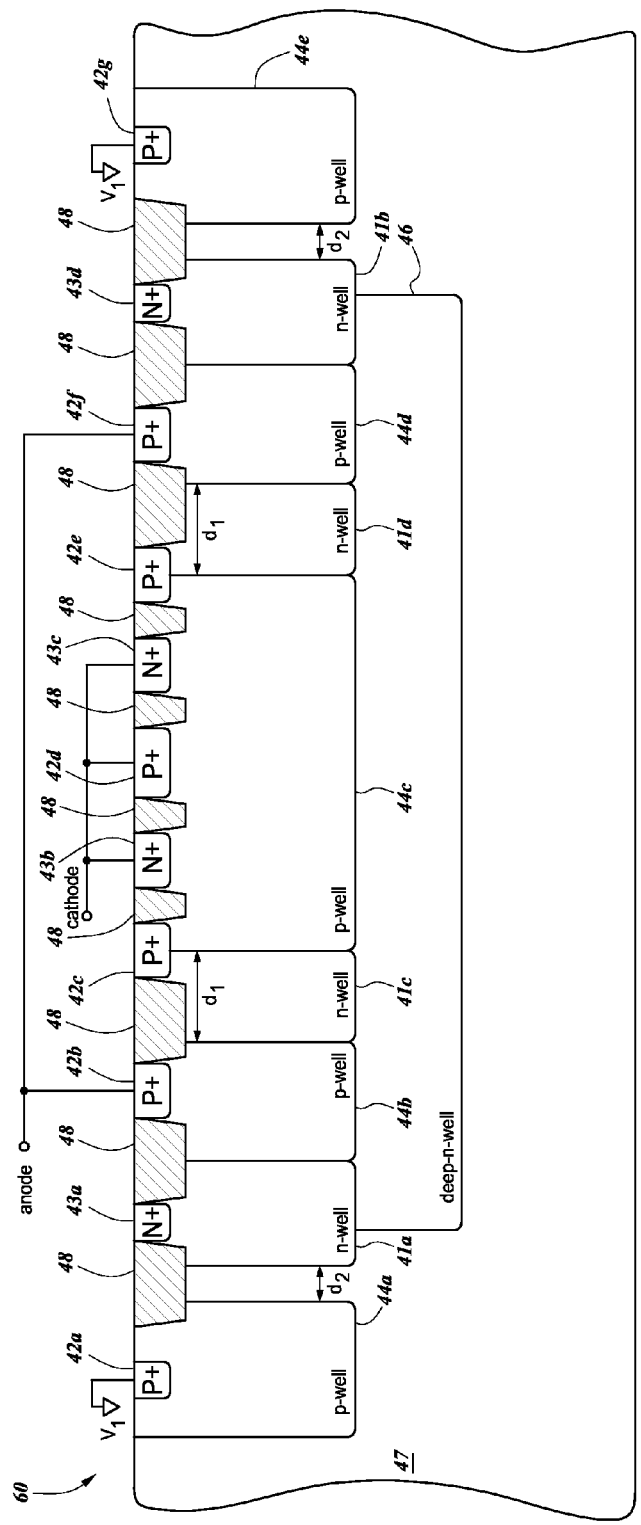
FIG. 7 is a cross section of another embodiment of an HRBV device.

FIG. 7 is a cross section of another embodiment of an HRBV device 60. The HRBV device 60 of FIG. 7 is similar to the HRBV device 40 of FIG. 4. However, in contrast to the HRBV device 40 of FIG. 4, the HRBV device 60 of FIG. 7 further includes n-wells 41c, 41d. For example, the n-well 41c has been provided between the p-well 44b and the p-well 44c, and the n-well 41d has been provided between the p-well 44c and the p-well 44d.

The HRBV device 60 can have an equivalent circuit as shown by the circuit of FIG. 6. Additionally, the n-wells 41c, 41d can operate as a base of the NPN bipolar transistor 58, and as a collector for the third PNP bipolar transistor 53. The inclusion of the n-wells 41c, 41d can reduce the collector-emitter breakdown of the NPN bipolar transistor 58, thereby permitting tuning of the trigger voltage of the HRBV device 60 to a lower value.

Figure 8:
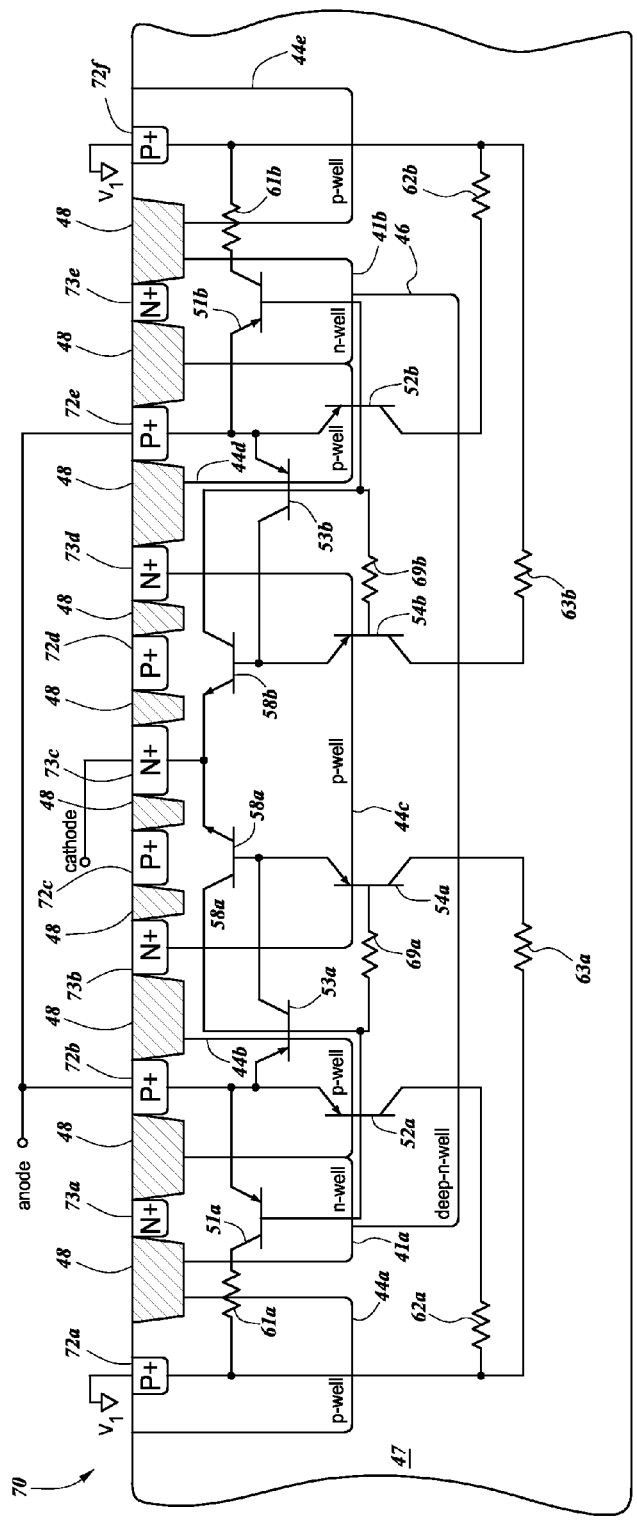
FIG. 8 is an annotated cross section of another embodiment of an HRBV device.
Figure 9:
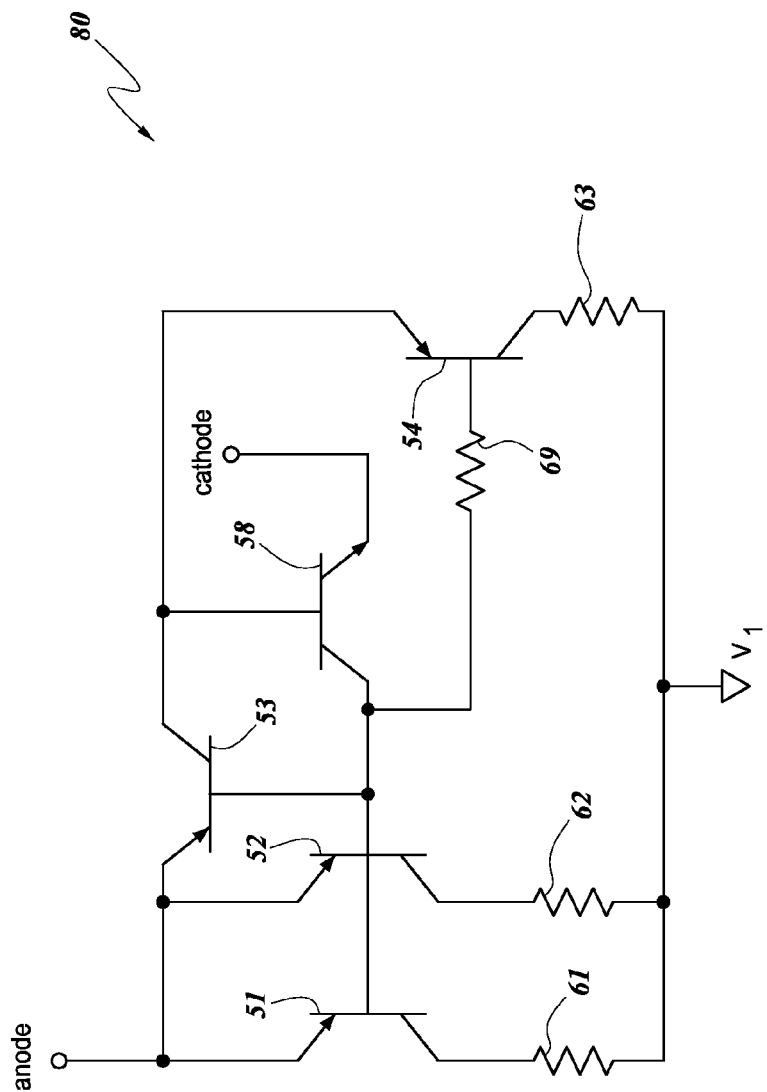
FIG. 9 is an equivalent circuit diagram of the HRBV device of FIG. 8.

FIG. 8 is an annotated cross section of another embodiment of an HRBV device 70. FIG. 9 is an equivalent circuit diagram of the HRBV device 70 of FIG. 8.

The annotated cross section of the HRBV device 70 includes a p-type substrate 47, n-type active areas 73a-73e, p-type active areas 72a-72f, n-wells 41a, 41b, p-wells 44a-44e, deep n-well 46, and isolation regions 48. The cross section has been annotated to show certain circuit devices formed from the layout, such as first PNP bipolar transistors 51a, 51b, second PNP bipolar transistors 52a, 52b, third PNP bipolar transistors 53a, 53b, fourth PNP bipolar transistors 54a, 54b, NPN bipolar transistors 58a, 58b, first resistors 61a, 61b, second resistors 62a, 62b, third resistors 63a, 63b, and fifth resistors 69a, 69b.

The first PNP bipolar transistors 51a, 51b can be formed from the p-wells 44b, 44d, n-wells 41a, 41b and the substrate 47, and can be lateral parasitic PNP devices. The first PNP bipolar transistor 51a can have an emitter formed from the p-well 44b, a base formed from the n-well 41a, and a collector formed from the substrate 47. Similarly, the first PNP bipolar transistor 51b can have an emitter formed from the p-well 44d, a base formed from the n-well 41b, and a collector formed from the substrate 47. The second PNP bipolar transistors 52a, 52b can be formed from the p-wells 44b, 44d, the deep n-well 46, and the substrate 47, and can be vertical parasitic PNP devices. The second PNP bipolar transistor 52a can have an emitter formed from the p-well 44b, a base formed from the deep n-well 46, and a collector formed from the substrate 47. Similarly, the second PNP bipolar transistor 52b can have an emitter formed from the p-well 44d, a base formed from the deep n-well 46, and a collector formed from the substrate 47.

The third PNP bipolar transistors 53a, 53b can be formed from the p-wells 44b-44d and the deep n-well 46, and can be lateral parasitic PNP devices. For example, the third PNP bipolar transistor 53a can have an emitter formed from the p-well 44b, a base formed from the deep n-well 46, and a collector formed from the p-well 44c. Similarly, the third PNP bipolar transistor 53b can have an emitter formed from the p-well 44d, a base formed from the deep n-well 46, and a collector formed from the p-well 44c. The fourth PNP bipolar transistors 54a, 54b can be formed from the p-well 44c, deep n-well 46, and the substrate 47, and can be vertical parasitic PNP devices. The fourth PNP bipolar transistors 54a, 54b can each have an emitter formed from the p-well 44c, a base formed from the deep n-well 46, and a collector formed from the substrate 47.

The NPN bipolar transistors 58a, 58b can be formed from the n-type active area 73c, the p-well 44c, and the deep n-well 46, and can be lateral parasitic NPN devices. For example, the NPN bipolar transistor 58a can have an emitter formed from the n-type active area 73c, a base formed from the p-well 44c, and a collector formed from the deep n-well 46. Likewise, the NPN bipolar transistor 58b can have an emitter formed from the n-type active area 73c, a base formed from the p-well 44c, and a collector formed from the deep n-well 46.

The first resistors 61a, 61b can be formed from the resistance between the collectors of the first PNP bipolar transistors 51a, 51b and the p-type active areas 72a, 72f. For example, the resistance along the paths between the collectors of the lateral PNP bipolar transistors 51a, 51b and p-type active areas 72a, 72f can be modeled by the first resistors 61a, 61b. Similarly, the second resistors 62a, 62b can be formed from the resistance between the collectors of the second PNP bipolar transistors 52a, 52b and the p-type active areas 72a, 72f, and the third resistors 63a, 63b can be formed from the resistance between the collectors of the fourth PNP bipolar transistors 54a, 54b and the p-type active areas 72a, 72f. Additionally, the fifth resistors 69a, 69b can be formed from the resistance between the bases of the PNP bipolar transistors 51a, 51b and the deep n-well 46.

The p-type active areas 72a, 72f and the p-wells 44a, 44e can form a guard ring around the HRBV device 70. The guard ring can be employed to eliminate the formation of unintended parasitic paths and in collecting mobile charges from the substrate, thereby protecting the HRBV device 70 from latch-up, as was described above.

Persons having ordinary skill in the art will appreciate that the cross section shown in FIG. 8 can correspond to the equivalent circuit shown in FIG. 9. For example, the first PNP bipolar transistors 51a, 51b can be represented by a first PNP bipolar transistor 51, the second PNP bipolar transistors 52a, 52b can be represented by a second PNP bipolar transistor 52, the third PNP bipolar transistors 53a, 53b can be represented by a third PNP bipolar transistor 53, and the fourth PNP bipolar transistors 54a, 54b can be represented by a fourth PNP bipolar transistor 54. Similarly, the NPN bipolar transistors 58a, 58b can be represented by an NPN bipolar transistor 58, the first resistors 61a, 61b can be represented by a first resistor 61, the second resistors 62a, 62b can be represented by a second resistor 62, the third resistors 63a, 63b can be represented by a third resistor 63, and the fifth resistors 69a, 69b can be represented by a fifth resistor 69. The fourth resistor 68 (FIG. 6) is not present in the embodiment illustrated in FIGS. 8 and 9.

With reference to FIG. 9, the emitter of the first PNP bipolar transistor 51 is electrically connected to the emitters of the second and third PNP bipolar transistors 52, 53 at a node labeled anode. The base of the first PNP bipolar transistor 51 is electrically connected to collector of the NPN bipolar transistor 58, to a first end of the fifth resistor 69, and to the bases of the second and third PNP bipolar transistors 52, 53. The collector of the first PNP bipolar transistor 51 is electrically connected to a first end of the first resistor 61. The first resistor 61 further includes a second end electrically connected to a voltage reference $V_1$, which can be any suitable low impedance node, such as a ground node or a negative voltage supply. The collector of second PNP bipolar transistor 52 is electrically connected to a first end of the second resistor 62. The second resistor 62 further includes a second end electrically connected to the voltage reference $V_1$.

The base of the NPN bipolar transistor 58 is electrically connected to the collector of the third PNP bipolar transistor 53 and to an emitter of the fourth PNP bipolar transistor 54. The emitter of the NPN bipolar transistor 58 is electrically connected to a node labeled cathode. The base of the fourth PNP bipolar transistor 54 is electrically connected to a second end of the fifth resistor 69, and the collector of the fourth PNP bipolar transistor 54 is electrically connected to a first end of the third resistor 63. The third resistor 63 further includes a second end electrically connected to the voltage reference $V_1$.

The HRBV device 80 can protect an IC from a transient electrical event that causes the voltage of the anode to increase relative to the voltage of the cathode. The emitter-base junctions of the PNP bipolar transistors 51-53 can provide a voltage equal to about the anode voltage to the collector of the NPN bipolar transistor 58. During a transient electrical event that increases the voltage of the anode relative to the voltage of the cathode, the voltage at the collector of the NPN bipolar transistor 58 can increase until the relatively low collector-emitter breakdown voltage of the open-base NPN bipolar transistor 58 is reached. The breakdown of the collector-emitter of the NPN bipolar transistor 58 can stimulate a flow of current through the open-base PNP bipolar transistor 53 at a relatively low voltage, such as the low voltages used in certain automotive infotainment applications. The flow of current through the PNP bipolar transistor 53 can cause the base-emitter junction of the NPN bipolar transistor 58 to become forward-biased, thereby stimulating an amplified flow of current through the NPN bipolar transistor 58 and transitioning the HRBV device 80 into a low-impedance dual-carrier injection regenerative state defining the forward trigger voltage of the HRBV device 80.

As described above, the forward trigger voltage of the HRBV device 80 can be relatively low and can be defined by the coupled amplification effect of the open-base NPN bipolar transistor 58 and the open-base PNP bipolar transistor 53. Since the forward trigger voltage of the HRBV device 80 can be relatively low and can be less than that of the HRBV-LFTV device of FIG. 6, the HRBV device 80 of FIG. 9 can be referred to as a very low forward trigger voltage (VLFTV) or HRBV-VLFTV device.

The HRBV device shown in FIGS. 8-9 can withstand a relatively large voltage between the cathode and anode while maintaining a relatively low leakage. The relatively high reverse breakdown voltage can be determined based upon a breakdown between the deep n-well 46 and each of the p-wells 44b, 44d. Since the p-wells 44b, 44d and the deep n-well 46 can be relatively lightly doped, junction breakdown can occur at a relatively high voltage. For example, the breakdown between the p-wells 44b, 44d and the deep n-well 46 can be amongst the highest voltage blocking junctions in certain advanced CMOS, high voltage CMOS, and BCD-MOS processes, for instance, larger than about 45 V in a process optimized for about 20 V circuit applications.

Figure 10:
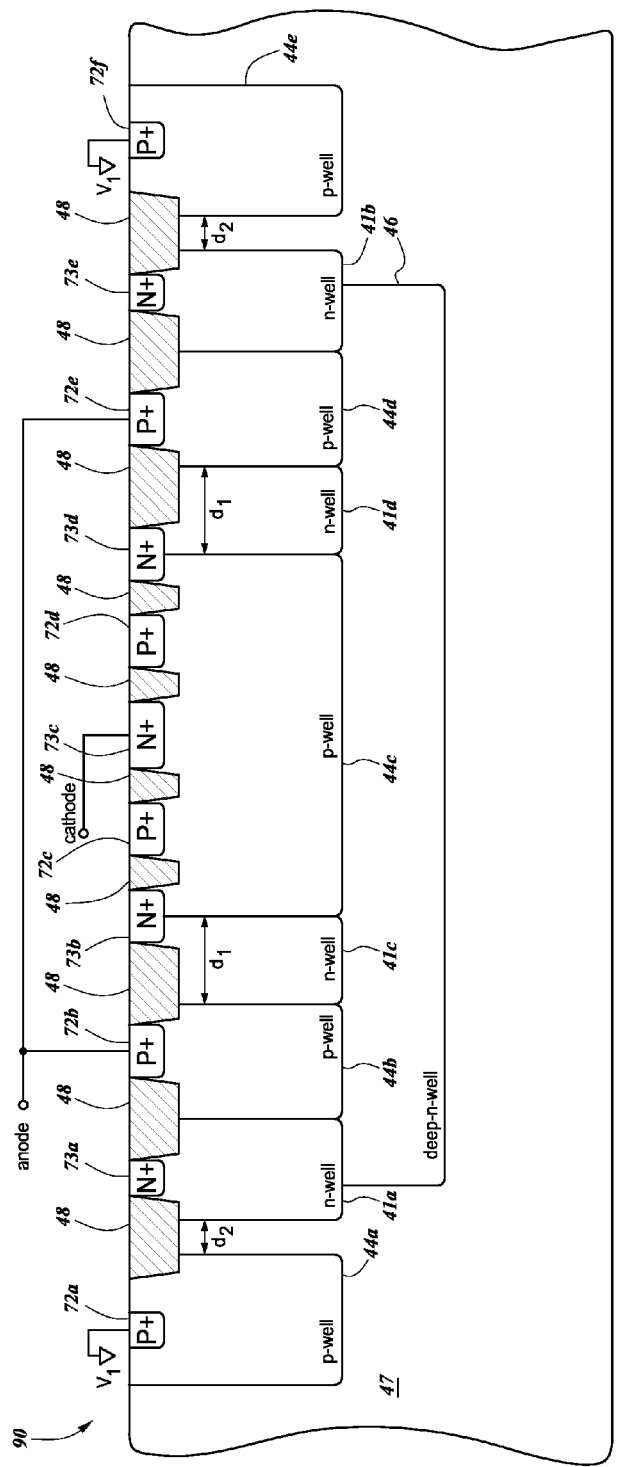
FIG. 10 is a cross section of another embodiment of an HRBV device.

FIG. 10 is a cross section of another embodiment of an HRBV device 90. The HRBV device 90 of FIG. 10 is similar to the HRBV device 70 of FIG. 8. However, in contrast to the HRBV device 70 of FIG. 8, the HRBV device 90 of FIG. 10 further includes n-wells 41c, 41d. For example, the n-well 41c has been provided between the p-well 44b and the p-well 44c, and the n-well 41d has been provided between the p-well 44c and the p-well 44d. Inclusion of the n-wells 41c, 41d can aid in achieving a very low trigger voltage for the HRBV device 90.

The HRBV device 90 can have an equivalent circuit as shown by the circuit of FIG. 9. Additionally, the n-wells 41c, 41d can operate as a base of the NPN bipolar transistor 58 and as a collector for the third PNP bipolar transistor 53. The inclusion of the n-wells 41c, 41d can reduce the collector-emitter breakdown of the NPN bipolar transistor 58, thereby aiding in tuning the very low trigger voltage of the HRBV device 90.

Figure 11A:
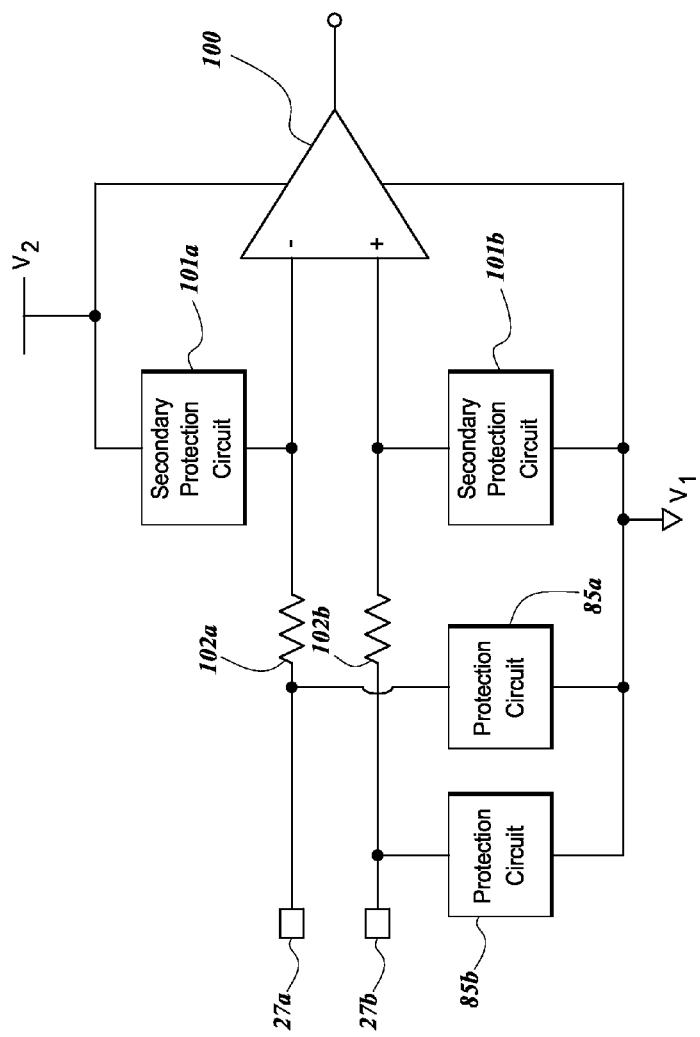
FIG. 11A is a schematic diagram of an input driver using a protection circuit in accordance with one embodiment.

FIG. 11A is a schematic diagram of an input driver 100 using a protection circuit in accordance with one embodiment. The input driver 100 is electrically connected between first and second voltage references $V_1$, $V_2$, which can be, for example, negative and positive power supplies, respectively. The input driver 100 includes an inverting input electrically coupled to a first pad 27a through a first resistor 102a, and a non-inverting input electrically coupled to a second pad 27b through a second resistor 102b. To provide protection to the input driver 100 from transient electrical events, protection circuits 85a, 85b and secondary protection circuits 101a, 101b have been provided. The input driver 100 can be used in a video amplifier for an automotive infotainment application or in any other suitable circuit.

The protection circuit 85a includes a first end electrically connected to the first pad 27a and a second end electrically connected to the first voltage reference $V_1$, and the protection circuit 85b includes a first end electrically connected to the second pad 27b, and a second end electrically connected to the first voltage reference $V_1$. The pad protection circuits 85a, 85b can include HRBV devices tuned to achieve a desired forward and reverse protection response for the input driver 100, as will described below with reference to FIGS. 11B-11C.

As illustrated in FIG. 11A, secondary protection circuits can be provided in addition to protection circuits including HRBV devices. For example, the secondary protection circuit 101a has been electrically connected between the second voltage reference $V_2$ and the inverting input of the input driver 100, and the secondary protection circuit 101b has been electrically connected between the second voltage reference $V_2$ and the non-inverting input of the input driver 100. Including secondary protection circuits, such as the secondary protection circuits 101a, 101b, can aid in providing auxiliary protection against transient electrical events and clamping functionality directly at the inputs of the input driver.

Figure 11B:
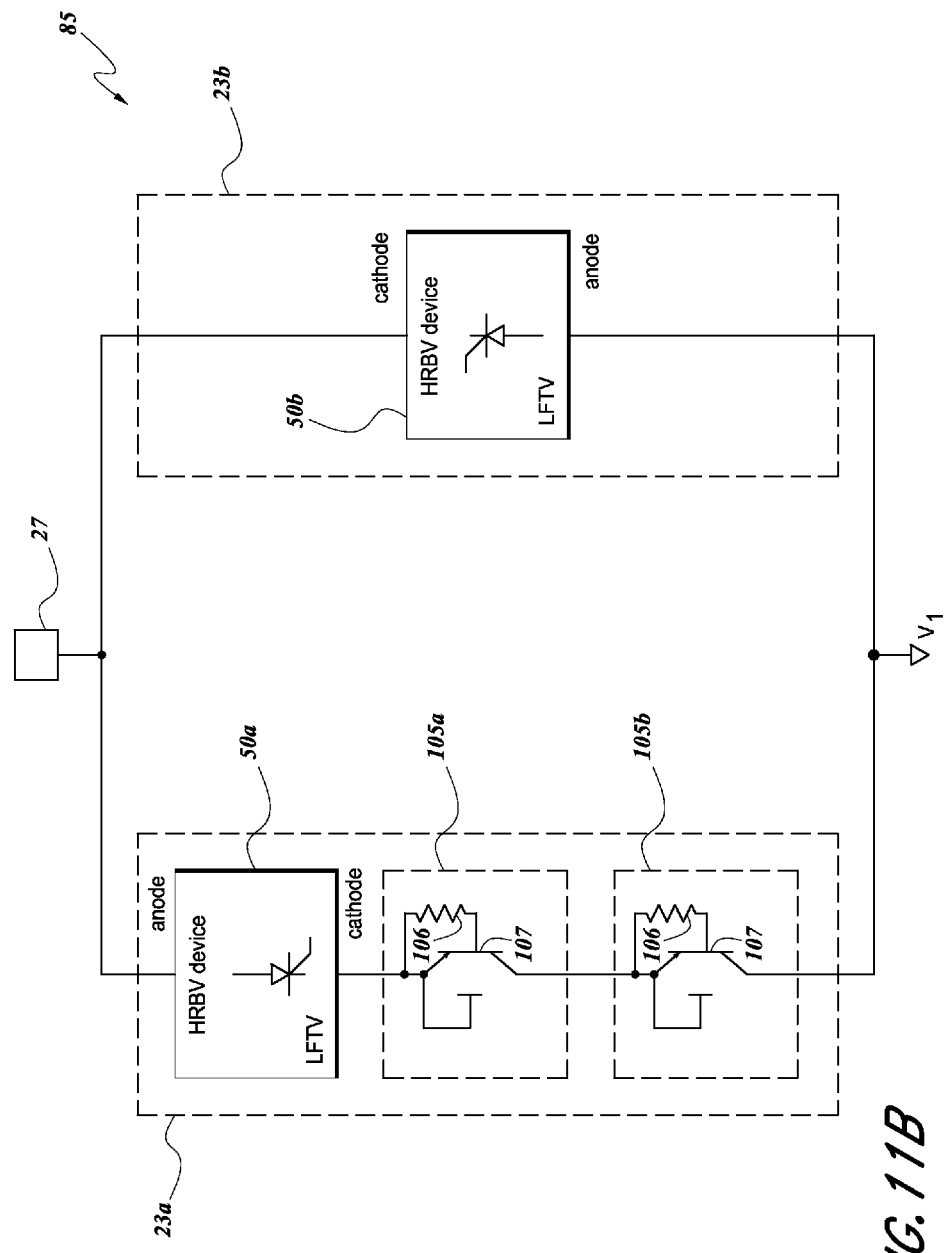
FIG. 11B is a schematic diagram of one example of a protection circuit for use with the input driver of FIG. 11A

FIG. 11B is a schematic diagram of one example of a protection circuit 85 for use with the input driver of FIG. 11A. The protection circuit 85 includes a forward pad protection circuit 23a and a reverse pad protection circuit 23b, each of which is electrically connected between the pad 27 and the voltage reference $V_1$. The forward pad protection circuit 23a includes a first HRBV device 50a, a first high holding voltage MOS PNP bipolar device 105a, and a second high holding voltage MOS PNP bipolar device 105b. The reverse pad protection circuit 23b includes a second HRBV device 50b. The protection circuit 85 can be used to protect any suitable pad, such as the pads 27a, 27b of FIG. 11A, from transient electrical events.

The first HRBV device 50a includes an anode electrically connected to the pad 27 and a cathode electrically connected to a first end of the first MOS PNP device 105a. The first MOS PNP device 105a further includes a second end electrically connected to a first end of the second MOS PNP device 105b. The second MOS PNP device 105b further includes a second end electrically connected to the voltage reference $V_1$. The second HRBV device 50b includes an anode electrically connected to the voltage reference $V_1$ and a cathode electrically connected to the pad 27.

The first and second HRBV devices 50a, 50b can be any suitable HRBV device, including for example, the HRBV-LFTV device 50 shown in FIG. 6. As illustrated, the first and second HRBV devices 50a, 50b can be provided alone or in combination with other protection devices to obtain a desired forward and reverse protection response. For example, the first HRBV device 50a has been electrically connected in a cascade with the first and second MOS PNP devices 105a, 105b to provide the desired forward protection response and the second HRBV device 50b has been provided without additional devices to provide the desired reverse protection response. The HRBV devices 50a, 50b can be used to obtain a desired forward and reverse protection response even when the reverse breakdown voltages of the other devices added to achieve the target operating conditions, such as the MOS PNP devices 105a, 105b in series with the first HRBV device 50a, do not have relatively high reverse breakdown voltages.

Since the first HRBV device 25a can have a relatively large reverse breakdown voltage, the inclusion of the first HRBV device 50a in the forward protection circuit 23a with the anode electrically coupled to the pad 27 and the cathode electrically coupled to the voltage reference $V_1$ can prevent the forward pad protection circuit 23a from activating for a transient signal event having a negative signal voltage, thereby permitting the reverse pad protection circuit 23b to provide the desired protection against negative transient electrical events. Similarly, the inclusion of the second HRBV device 50b in the reverse protection circuit 23b with the cathode electrically coupled to the pad 27 and the anode electrically coupled to the voltage reference $V_1$ can prevent the reverse protection circuit 23b from activating for a transient signal event having a positive signal voltage, thereby permitting the forward pad protection circuit 23a to be provide the desired protection against positive transient electrical events. Additionally, the first and second HRBV devices 25a, 25b can have relatively low forward trigger voltages, which permits the forward and reverse protection circuits 23a, 23b to be cascaded with other devices to achieve the desired forward and reverse protection responses. Thus, the inclusion of the first and second HRBV devices 50a, 50b can aid in permitting the forward and reverse pad protections circuits 23a, 23b to be separately tuned, thereby achieving a pad protection circuit response that is desirable for a particular application.

Each of the MOS PNP devices 105a, 105b includes a first end, a second end, a resistor 106 and a MOS PNP bipolar transistor 107 formed from a P-MOS transistor. The parasitic MOS PNP bipolar transistor 107 can have an emitter formed from the source of the P-MOS transistor, a collector formed from the drain of the P-MOS transistor, and a base formed from the well of the P-MOS transistor. The first end of each parasitic P-MOS device is electrically connected to the emitter of the MOS PNP bipolar transistor 107, to a first end of the resistor 106, and to a gate of the P-MOS transistor. The second end of each parasitic MOS PNP device is electrically connected to the collector of the MOS PNP bipolar transistor 107. The resistor 106 further includes a second end electrically connected to the base of the MOS PNP bipolar transistor 107. Additional details of the MOS PNP devices 105a, 105b can be as described below with reference to FIG. 12.

Although the first HRBV device 50a is illustrated as being cascaded with MOS PNP bipolar devices 105a, 105b in connection with its high holding voltage properties for an emitter to collector stress condition, persons having ordinary skill in the art will appreciate that the MOS PNP bipolar devices 105a, 105b are just one example of a protection device that can be cascaded with the HRBV devices described herein. For example, any suitable protection device, including, for example, P-MOS transistors, N-MOS transistors, PNP transistors, NPN transistors, silicon controlled rectifier structures, and/or diodes can be cascaded with HRBV devices in certain implementations. For instance, the first HRBV device 50a can be cascaded with an N-MOS, two N-MOSs, an N-MOS and a P-MOS, an N-MOS and a silicon controlled rectifier, a P-MOS and a silicon controlled rectifier, two silicon controlled-rectifier devices, a PNP transistor, two PNP transistors, an NPN transistor, two NPN transistors, an NPN and a PNP transistor, and/or any suitable combination of protection devices sized and selected to sustain a relatively large current using a relatively small cell footprint.

Figure 11C:
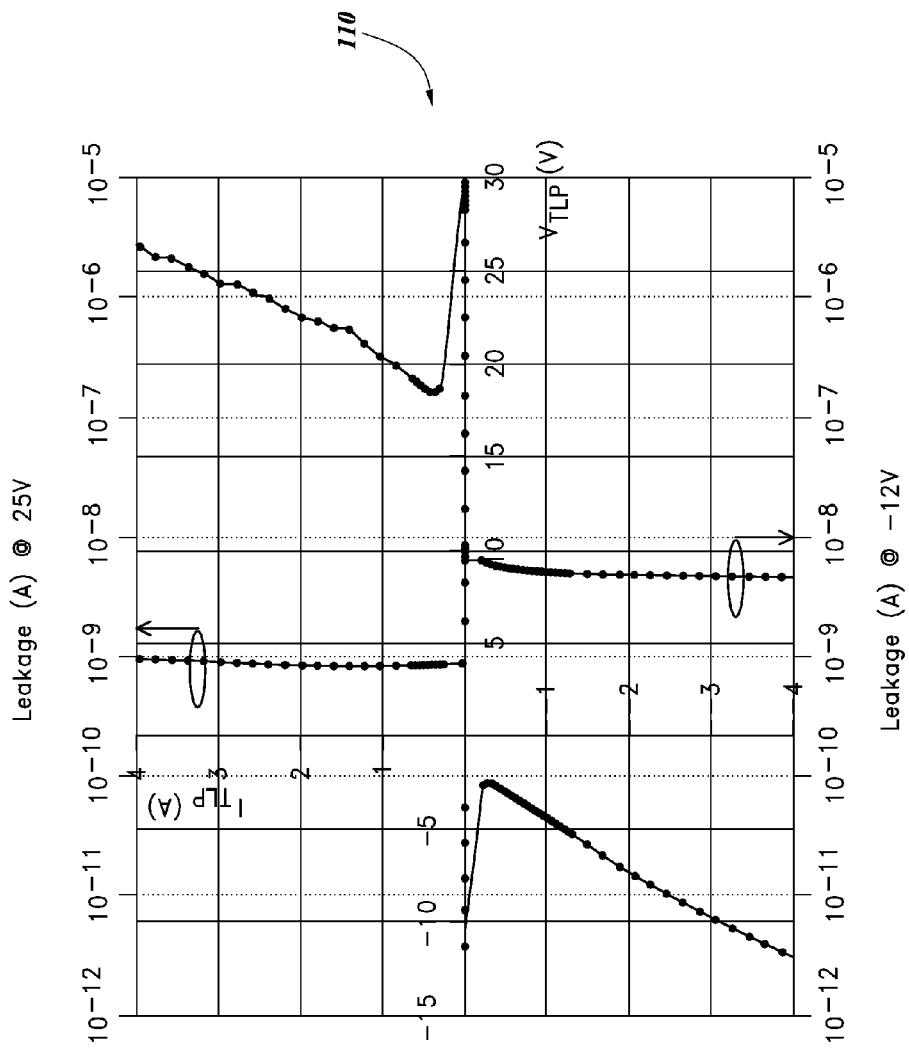
FIG. 11C is a graph of transmission line pulsing (TLP) laboratory data for one example of the protection circuit of FIG. 11B.

FIG. 11C is a graph 110 of transmission line pulsing (TLP) laboratory data for one example of the protection circuit 85 of FIG. 11B. The illustrated graph 110 shows TLP voltage versus TLP current and TLP current versus leakage current for one implementation of the protection circuit 85.

The graph 110 illustrates that the pad protection circuit 85 can exhibit an asymmetric bidirectional protection response. For example, from quasi-static current-voltage TLP lab measurements, the pad protection circuit can have a forward trigger voltage $V_{T-F}$ of about 29.5 V, a forward holding voltage $V_{H-F}$ of about 18.5 V, a reverse trigger voltage $V_{T-F}$ of about −12.5 V, and a reverse holding voltage $V_{H-R}$ of about −2.4 V. Additionally, the pad protection circuit has a relatively low leakage at normal operating conditions of less than about 500 pA at normal operating voltage, in the case of this configuration for applications operating between about 10 V and about 18 V and required to trigger in the range of about 25 V to about 30 V in the positive direction and in the range of about −12 V to about −15 V in the negative direction. The relatively stringent operating conditions described above are one example of a requirement for emerging signal conditioning circuits in zero-defect automotive IC applications, which are also required to sustain at certain input/output pins relatively high stress conditions that can go in excess of 8000 V HBM (human body model).

Although the graph 110 shows one example of a forward and reverse protection response, persons having ordinary in the art will appreciate that a different arrangement of protection devices can be cascaded in the protection circuit 85 to achieve a desired protection response. For example, the first HRBV device 50a can be cascaded with an N-MOS, two N-MOSs, an N-MOS and a P-MOS, an N-MOS and a silicon controlled rectifier, a P-MOS and a silicon controlled rectifier, two silicon controlled-rectifier devices, a PNP transistor, two PNP transistors, an NPN transistor, two NPN transistors, an NPN and a PNP transistor, and/or any suitable combination of protection devices sized and selected to sustain a relatively large current using a relatively small cell footprint.

Figure 12:
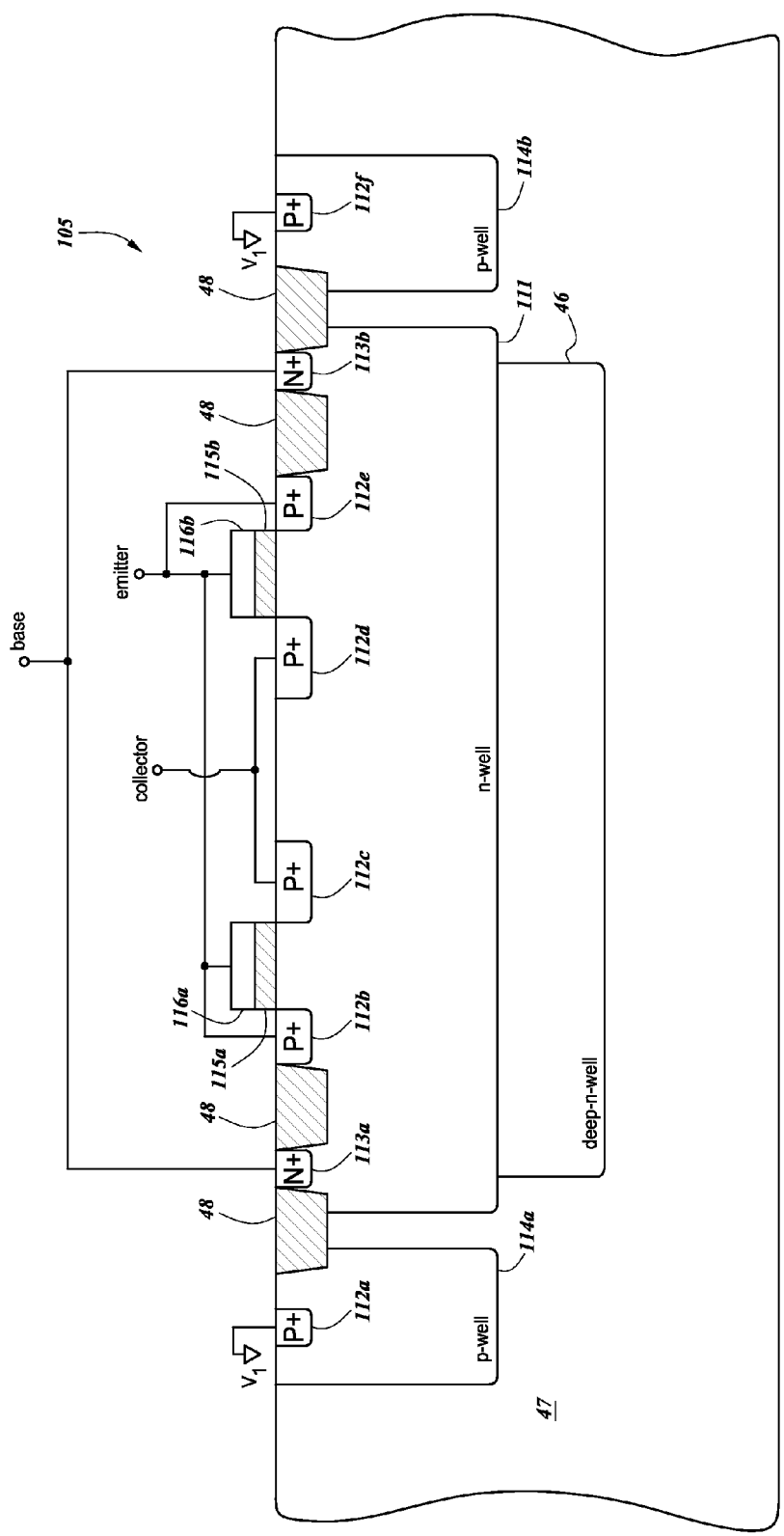
FIG. 12 is a cross section of an example of a MOS PNP device for use with the protection circuit of FIG. 11B.

FIG. 12 is a cross section of an example of a MOS PNP device 105 for use with the protection circuit of FIG. 11B. The MOS PNP device 105 illustrates one implementation of the MOS PNP devices 105a, 105b of FIG. 11B. The MOS PNP device 105 includes a p-type substrate 47, n-type active areas 113a, 113b, p-type active areas 112a-112f, n-well 111, p-wells 114a, 114b, deep n-well 46, isolation regions 48, gate oxides 115a, 115b, and gates 116a, 116b.

A MOS PNP bipolar transistor can be formed from the illustrated cross section. For example, the p-type active areas 112c, 112d can operate as the collector of the PNP bipolar transistor, the p-type active areas 112b, 112e can operate as an emitter of the PNP bipolar transistor, and the n-well 111 and n-type active areas 113a, 113b can operate as a base of the PNP bipolar transistor. Although the illustrated cross section also includes a P-MOS structure associated with p-type active areas 112b-112e, gates 116a, 116b, gate oxides 115a, 115b, and n-well 111, the illustrated P-MOS structure plays a relatively minor role in providing transient electrical event protection. Rather, the P-MOS structure has been used to create a parasitic MOS PNP bipolar device. Forming a MOS PNP bipolar transistor from a P-MOS structure can be useful for a variety of reasons, such as for providing a PNP bipolar device for transient electrical event protection in a process lacking dedicated bipolar transistor masks.

The p-type active areas 112a, 112f and the p-wells 114a, 114b can form a guard ring around the MOS PNP device 105. The guard ring can be employed to eliminate the formation of unintended parasitic paths and in collecting mobile charges from the substrate, thereby protecting the device from latch-up. As illustrated, the p-wells 114a, 114b can be spaced from the n-well 111 to aid in preventing the unintended activation of PNP devices having emitter, base and collector junctions formed from the p-wells 114a, the n-well 111, and the p-type active areas 112b-112e, respectively.

Figure 13A:
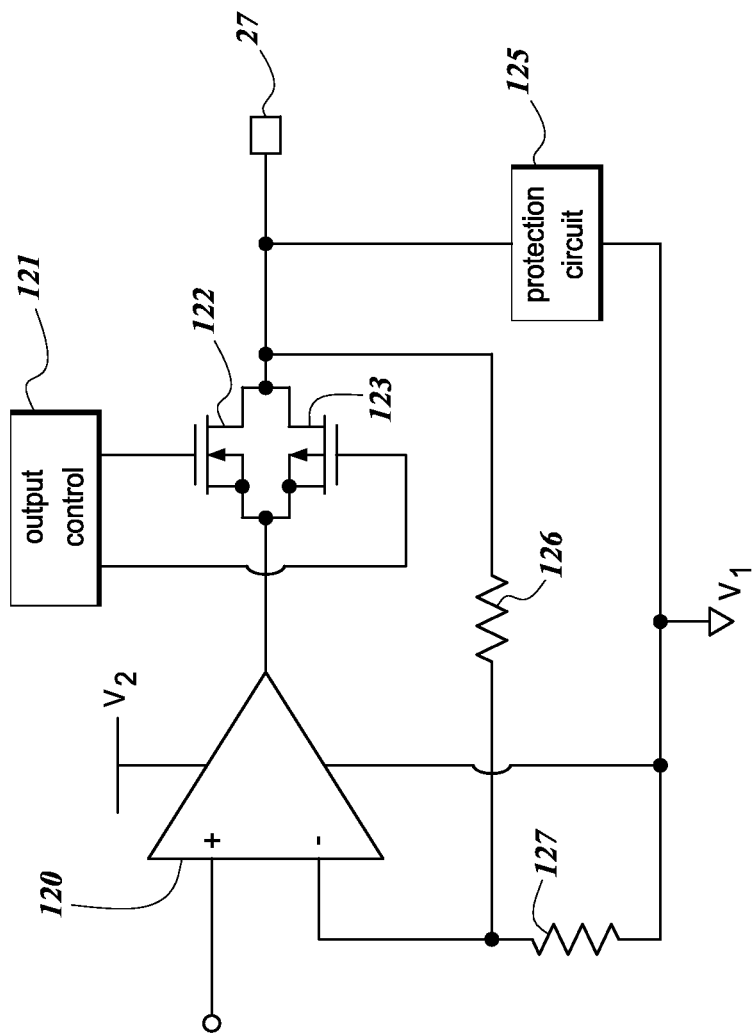
FIG. 13A is a schematic diagram of an output driver using a protection circuit in accordance with one embodiment.

FIG. 13A is a schematic diagram of an output driver 120 using a protection circuit in accordance with one embodiment. The output driver 120 is electrically connected between first and second voltage references $V_1$, $V_2$, which can be, for example, negative and positive power supplies, respectively. The output driver 120 includes a non-inverting input, an inverting input, and an output. The illustrated schematic also includes a pad 27, first and second resistors 126, 127, n-type and p-type field-effect transistors 122, 123, an output control block 121, and a protection circuit 125. The output driver 120 can be used in a video amplifier for an automotive infotainment application or in any other suitable circuit.

The output of the output driver 120 is electrically connected to the sources and bodies of the n-type and p-type field effect transistors 122, 123. The drains of the n-type and p-type field effect transistors 122, 123 are electrically connected to the pad 27, and the gates of the n-type and p-type field effect transistors 122, 123 are electrically connected to the output control block 121. The output control block 121 can be used to vary the channel impedance of the n-type and p-type field effect transistors 122, 123, thereby permitting the output driver 120 to drive the pad 27.

The first resistor 126 includes a first end electrically connected to the pad 27, and a second end electrically to a first end of the second resistor 127 and to the inverted input of the output driver 120. The second resistor 127 further includes a second end electrically connected to the first voltage reference $V_1$. The first and second resistors 126, 127 can be used to provide a signal indicative of the voltage level of the pad 27 to the inverted input of the output driver 120.

The pad protection circuit 125 includes a first end electrically connected to the pad 27, and a second end electrically connected to the first voltage reference $V_1$. The pad protection circuit 125 can include one or more HRBV devices tuned to achieve a desired forward and reverse protection response, including an asymmetric forward and respond protection response for the output driver 120, as will described below with reference to FIGS. 13B-13E.

Figure 13B:
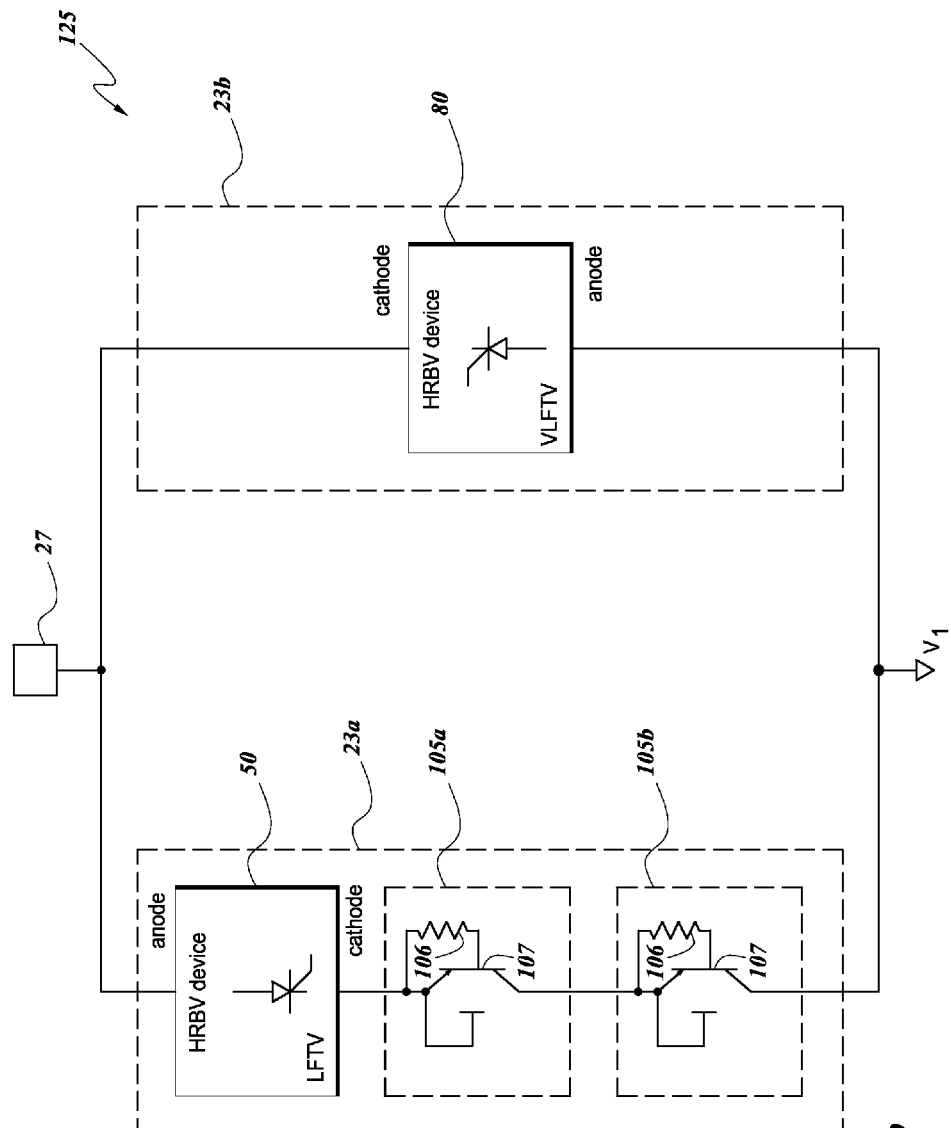
FIG. 13B is a schematic diagram of one example of a protection circuit for use with the output driver of FIG. 13A.

FIG. 13B is a schematic diagram of one example of a protection circuit 125 for use with the output driver 120 of FIG. 13A. The protection circuit 125 includes a forward pad protection circuit 23a and a reverse pad protection circuit 23b, each of which is electrically connected between the pad 27 and the voltage reference $V_1$. The forward pad protection circuit 23a includes a first HRBV device 50, a first MOS PNP bipolar device 105a, and a second MOS PNP bipolar device 105b. The reverse pad protection circuit 23b includes a second HRBV device 80. The protection circuit 125 can be used to protect any suitable pad from transient electrical events, such as the pad 27 of FIG. 13A.

The first HRBV device 50 includes an anode electrically connected to the pad 27 and a cathode electrically connected to a first end of the first MOS PNP device 105a. The first MOS PNP device 105a further includes a second end electrically connected to a first end of the second MOS PNP device 105b. The second MOS PNP device 105b further includes a second end electrically connected to the voltage reference $V_1$. The second HRBV device 80 includes an anode electrically connected to the voltage reference $V_1$ and a cathode electrically connected to the pad 27.

The first and second HRBV devices 50, 80 can be any suitable HRBV device. For example, the first HRBV device 50 can be the HRBV-LFTV device 50 shown in FIG. 6, and the second HRBV device 80 can be the HRBV-VLFTV device 80 shown in FIG. 9. As illustrated, the first and second HRBV devices 50, 80 can be provided alone or in combination with other protection devices to obtain a desired forward and reverse protection response. For example, the first HRBV device 50 has been cascaded with the first and second MOS PNP devices 105a, 105b to provide the desired forward protection response and the second HRBV device 80 has been provided without additional devices to provide the desired reverse protection response. Additional details of the first and second MOS PNP devices 105a, 105b can be as described earlier.

Although the first HRBV device 50 is illustrated as being cascaded with parasitic PNP bipolar devices 105a, 105b, persons having ordinary skill in the art will appreciate that the MOS PNP bipolar devices 105a, 105b are just one example of a protection device that can be cascaded with the HRBV devices described herein. For example, any suitable device, including, for example, P-MOS transistors, N-MOS transistors, PNP transistors, NPN transistors, silicon controlled rectifier structures, and/or diodes can be cascaded with HRBV devices in certain implementations. Additionally, although the second HRBV device 80 is the only protection device illustrated in the reverse protection circuit 23b, other protection devices can be included in the reverse protection circuit 23b to achieve a desired operating response. For example, the HRBV device 80 can be cascaded with one or more other devices properly sized and optimized to sustain a relatively large current, such as an N-MOS transistor, a P-MOS transistor, a silicon controlled rectifier, a PNP transistor, an NPN transistor, and/or any suitable combination thereof that can be used to achieve certain operating conditions using a relatively small protection cell footprint, as can be appreciated by persons having ordinary skill in the art.

Figure 13C:
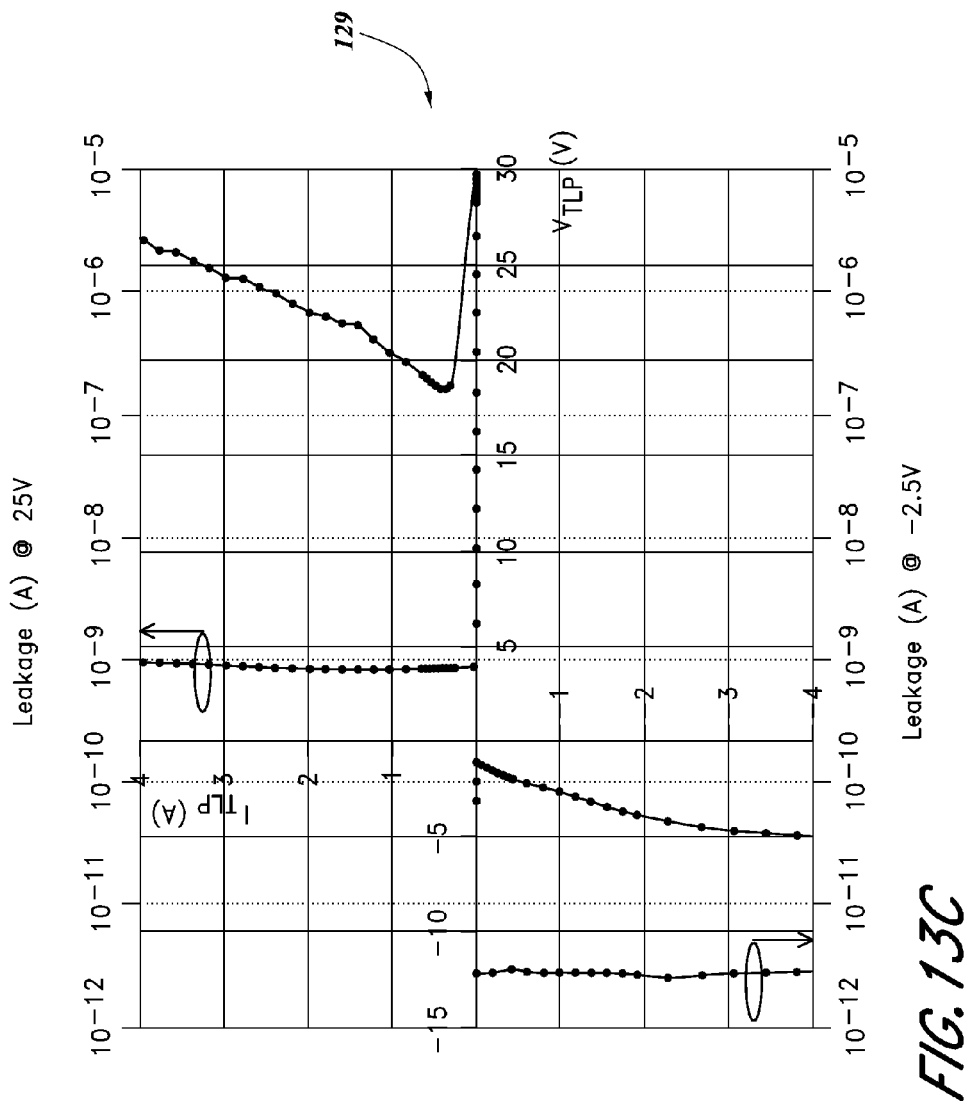
FIG. 13C is a graph of transmission line pulsing (TLP) laboratory data for one example of the protection circuit of FIG. 13B.

FIG. 13C is a graph 129 of transmission line pulsing (TLP) laboratory data for one example of the protection circuit 125 of FIG. 13B tested for the negative and positive stress conditions. The illustrated graph 129 shows TLP voltage versus TLP current and TLP current versus leakage current at predetermined leakage test voltages.

The graph 129 illustrates that the pad protection circuit 125 can exhibit an asymmetric bidirectional protection response. For example, the pad protection circuit has a forward trigger voltage $V_{T-F}$ of about 29.5 V, a forward holding voltage $V_{H-F}$ of about 18.5 V, a reverse trigger voltage $V_{T-F}$ of about −3.2 V, and a reverse holding voltage $V_{H-R}$ of about −1.3 V. Additionally, the pad protection circuit has a relatively low leakage of less than 500 pA at operating conditions, in the case of this configuration for applications operating between about −0.7 V and about 18 V and tuned to trigger in the range of about 25 V to about 30 V in the positive direction and lower than about −5 V in the negative direction.

Figure 13D:
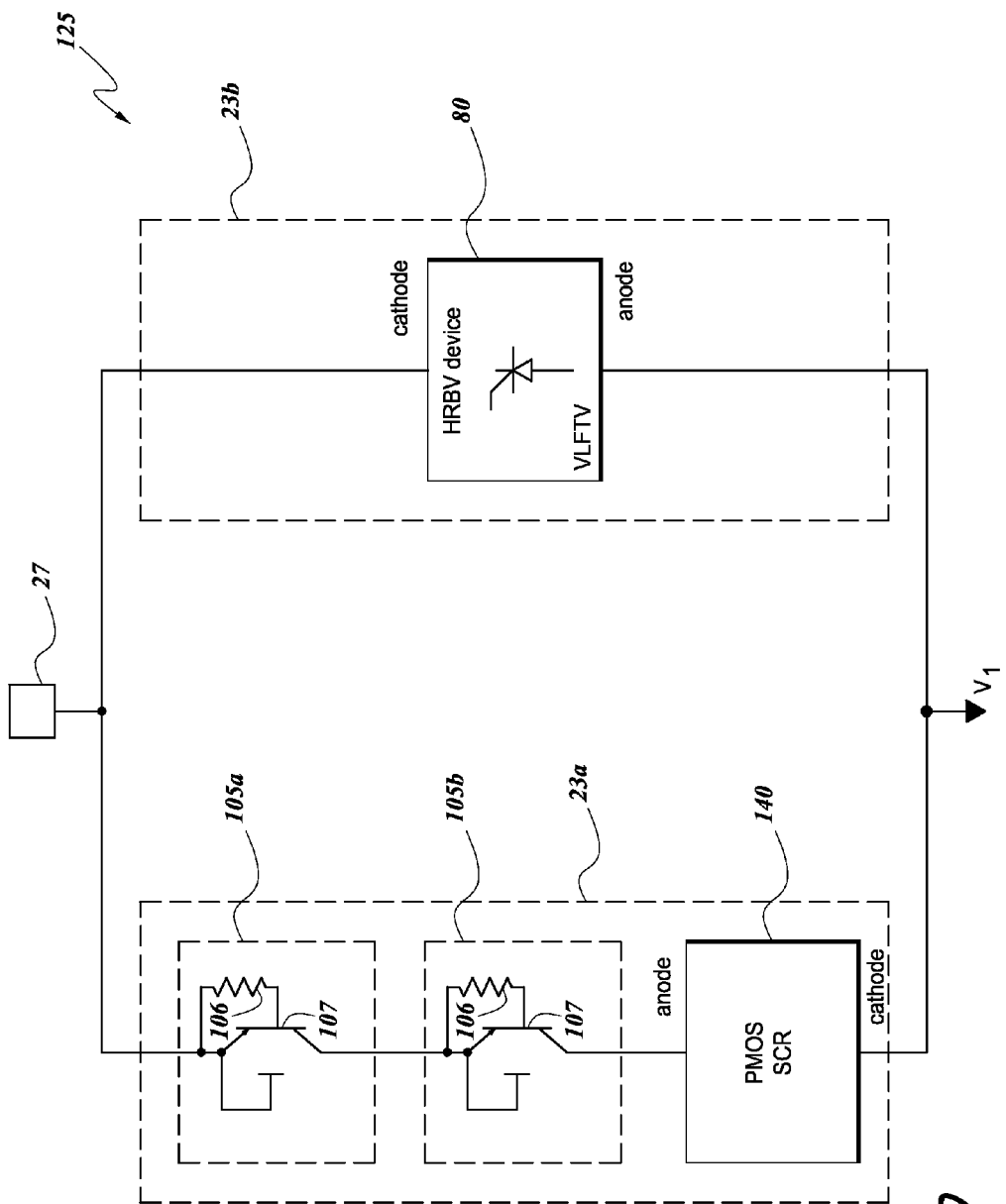
FIG. 13D is a schematic diagram of another example of the protection circuit of FIG. 13A.

FIG. 13D is a schematic diagram of another example implementation of the protection circuit 125 of FIG. 13A. The illustrated protection circuit can be used, for example, for applications having low forward operating and holding voltages, such as those above about 15 V but less than about 18 V, and having very low reverse trigger voltages. The protection circuit 125 includes a forward pad protection circuit 23a and a reverse pad protection circuit 23b, each of which is electrically connected between the pad 27 and the voltage reference $V_1$. The forward pad protection circuit 23a includes a first MOS PNP bipolar device 105a, and a second MOS PNP bipolar device 105b, and a P-MOS silicon controlled rectifier (SCR) device 140. The reverse pad protection circuit 23b includes an HRBV device 50. The protection circuit 125 can be used to protect any suitable pad from transient electrical events, such as the pad 27 of FIG. 13A.

The first MOS PNP device 105a includes a first end electrically connected to the pad 27, and a second end electrically connected to a first end of the second MOS PNP device 105b. The second MOS PNP device 105b further includes a second end electrically connected an anode of the P-MOS SCR device 140. The P-MOS SCR device 140 further includes a cathode electrically connected to the voltage reference $V_1$. The HRBV device 50 includes an anode electrically connected to the voltage reference $V_1$ and a cathode electrically connected to the pad 27.

The HRBV device 80 can be a suitable HRBV device, such as the HRBV-VLFTV device 80 shown in FIG. 9. As described above, the HRBV device 80 can be provided alone or in combination with other protection devices to obtain a desired reverse protection response.

In contrast to the reverse protection device 23b, the forward protection device 23a does not include an HRBV device. In certain embodiments, HRBV devices need not be included in both the forward and reverse pad protection circuits 23a, 23b. For example, in implementations in which the desired reverse holding and reverse trigger voltages are relatively low (for example, less than about 10 V), an HRBV device can be omitted from the forward pad protection circuit 23a. Similarly, when the desired forward holding and forward trigger voltages are relatively low, an HRBV device can be omitted from the reverse pad protection circuit 23b.

The forward pad protection circuit 23a includes the first and second MOS PNP devices 105a, 105b and the P-MOS SCR device 140. The first and second MOS PNP devices 105a, 105b can be as described earlier and can include, for example, a high value resistor 106 having a resistance greater than about 1 M-Ohm. The P-MOS SCR device 140 can be as described below with respect of FIGS. 14-15.

Figure 13E:
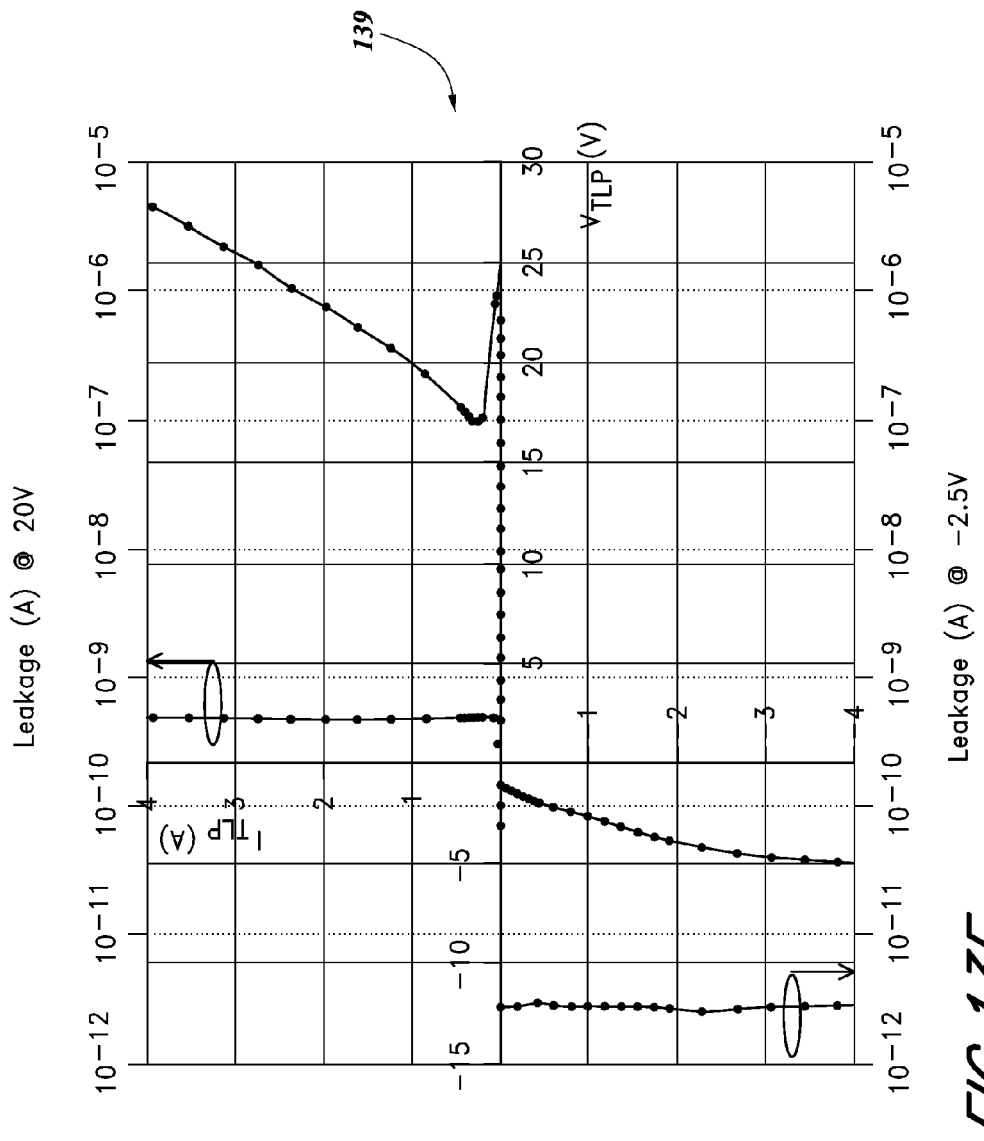
FIG. 13E is a graph of transmission line pulsing (TLP) laboratory data for one example of the protection circuit of FIG. 13E.

FIG. 13E is a graph 139 of transmission line pulsing (TLP) laboratory data for one example of the protection circuit 125 of FIG. 13E. The illustrated graph 139 shows TLP voltage versus TLP current and TLP current versus leakage current.

The graph 139 shows that the pad protection circuit 125 can exhibit an asymmetric bidirectional protection response with very low reverse conduction. For example, the pad protection circuit has a forward trigger voltage $V_{T-F}$ of about 23.5 V, a forward holding voltage $V_{H-F}$ of about 17 V, a reverse trigger voltage $V_{T-F}$ of about −3.2 V, and a reverse holding voltage $V_{H-R}$ of about −1.3 V. Additionally, the pad protection circuit has a relatively low leakage of less than about 500 pA at operating voltage, in the case of this configuration for applications operating between about −0.7 V and about 15 V and tuned to trigger in the range of about 20 V to about 25 V in the positive direction and lower than about −5 V in the negative direction.

Figure 14:
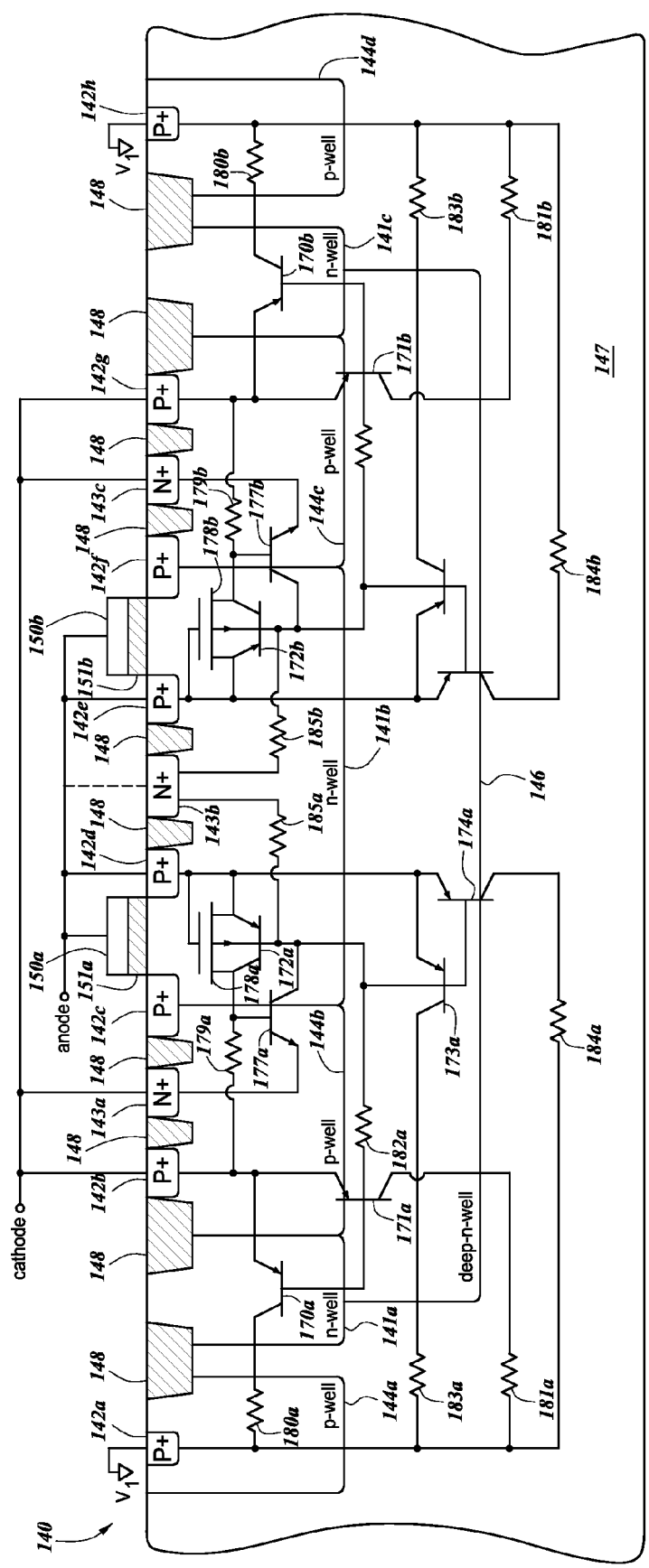
FIG. 14 is an annotated cross section of a P-MOS silicon controlled rectifier (SCR) device for use with the protection circuit of FIG. 13D.
Figure 15:
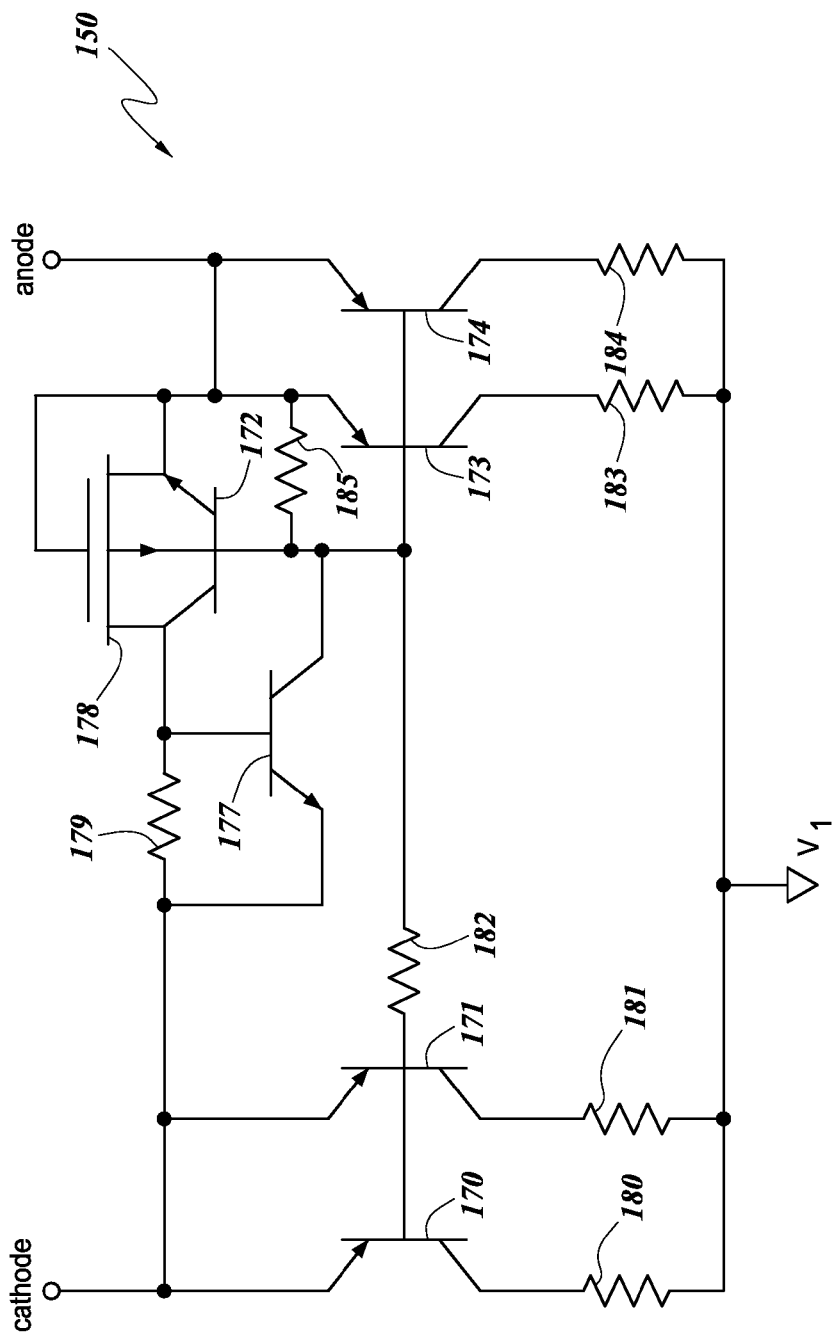
FIG. 15 is an equivalent circuit diagram of the P-MOS SCR device of FIG. 14.

FIG. 14 is an annotated cross section of a P-MOS silicon controlled rectifier (SCR) device 140 for use with the protection circuit 125 of FIG. 13D. FIG. 15 is an equivalent circuit diagram of the P-MOS SCR device 140 of FIG. 14.

The annotated cross section of the P-MOS SCR device 140 includes a p-type substrate 147, n-type active areas 143a-143c, p-type active areas 142a-142h, n-wells 141a-141c, p-wells 144a-144d, deep n-well 146, isolation regions 148, gates 150a, 150b, and gate oxides 151a, 151b. The cross section has been annotated to show certain circuit devices formed from the layout, such as first PNP bipolar transistors 170a, 170b, second PNP bipolar transistors 171a, 171b, third PNP bipolar transistors 172a, 172b, fourth PNP bipolar transistors 173a, 173b, fifth PNP bipolar transistors 174a, 174b, NPN bipolar transistors 177a, 177b, P-MOS transistors 178a, 178b, first resistors 179a, 179b, second resistors 180a, 180b, third resistors 181a, 181b, fourth resistors 182a, 182b, fifth resistors 183a, 183b, sixth resistors 184a, 184b, and seventh resistors 185a, 185b. The illustrated P-MOS SCR device 140 can undergo back end processing to form contacts and metallization. Skilled artisans will appreciate that these details have been omitted from this figure for clarity.

The first PNP bipolar transistors 170a, 170b can be formed from the p-wells 144b, 144c, n-wells 141a, 141c and the substrate 147, and can be lateral parasitic PNP devices. The first PNP bipolar transistor 170a can have an emitter formed from the p-well 144b, a base formed from the n-well 141a, and a collector formed from the substrate 147. Similarly, the first PNP bipolar transistor 170b can have an emitter formed from the p-well 144c, a base formed from the n-well 141c, and a collector formed from the substrate 147. The second PNP bipolar transistors 171a, 171b can be formed from the p-wells 144b, 144c, the deep n-well 146, and the substrate 147, and can be vertical parasitic PNP devices. The second PNP bipolar transistor 171a can have an emitter formed from the p well 144b, a base formed from the deep n-well 146, and a collector formed from the substrate 147. Similarly, the second PNP bipolar transistor 171b can have an emitter formed from the p-well 144c, a base formed from the deep n-well 146, and a collector formed from the substrate 147.

The third PNP bipolar transistors 172a, 172b can be formed from the p-type active areas 142d, 142e the n-well 141b, the p-wells 144b, 144c, and p-type active areas 142b, 142c, 142f, 142g, and can be lateral parasitic PNP devices. For example, the third PNP bipolar transistor 172a can have an emitter formed from the p-type active area 142d, a base formed from the n-well 141b, and a collector formed from the p-type active area 142c, the p-well 144b and connected through a resistor 179a to the p-type active area 142b. Similarly, the third PNP bipolar transistor 172b can have an emitter formed from the p-type active area 142e, a base formed from the n-well 141b, and a collector formed from the p-type active area 142f, the p-well 144c and connected through a resistor 179b to the p-type active area 142g.

The fourth PNP bipolar transistors 173a, 173b can be formed from the p-type active areas 142d, 142e, the n-well 141h, the deep n-well 146, and the substrate 147, and can be lateral parasitic PNP bipolar devices. For example, the fourth PNP bipolar transistor 173a can have an emitter formed from the p-type active area 142d, a base formed from the n-well 141b and the deep n-well 146, and a collector formed from the substrate 147. Similarly, the fourth PNP bipolar transistor 173b can have an emitter formed from the p-type active area 142e, a base formed from the n-well 141b and the deep n-well 146, and a collector formed from the substrate 147. The fifth PNP bipolar transistors 174a, 174b can be formed from the p-type active areas 142d, 142e, the n-well 141b, the deep n-well 146, and the substrate 147, and can be vertical parasitic PNP bipolar devices. For example, the fifth PNP bipolar transistor 174a can have an emitter formed from the p-type active area 142d, a base formed from the n-well 141b and the deep n-well 146, and a collector formed from the substrate 147. Similarly, the fifth PNP bipolar transistor 174b can have an emitter formed from the p-type active area 142e, a base formed from the n-well 141b and the deep n-well 146, and a collector formed from the substrate 147.

The NPN bipolar transistors 177a, 177b can be formed from the n-type active areas 143a, 143b, the p-wells 144b, 144c, and the n-well 141b, and can be lateral parasitic NPN devices. For example, the NPN bipolar transistor 177a can have an emitter formed from the n-type active area 143a, a base formed from the p-well 144b, and a collector formed from the n-well 141b. Similarly, the NPN bipolar transistor 177b can have an emitter formed from the n-type active area 143b, a base formed from the p-well 144b, and a collector formed from the n-well 141b.

The P-MOS transistors 178a, 178b can be formed from the p-type active areas 142c-142f, the gates 150a, 150b, the gate oxides 151a, 151b, and the n-well 141b. For example, the first P-MOS transistors 178a can have a source formed from the p-type active area 142d, a drain formed from the p-type active area 142c, a gate formed from the gate 150a and gate oxide 151a, and a body formed from the n-well 141b. Similarly, the second P-MOS transistors 178b can have a source formed from the p-type active area 142e, a drain formed from the p-type active area 142f, a gate formed from the gate 150b and gate oxide 151b, and a body formed from the n-well 141b.

The p-type active areas 142a, 142h and the p-wells 144a, 144d can form a guard ring around the P-MOS SCR device 140. The guard ring can be employed to eliminate the formation of unintended parasitic paths between the P-MOS SCR device 140 and surrounding semiconductor components when integrated on-chip.

The p-wells 144b, 144c can be electrically isolated from the substrate 147 using the n-wells 141a, 141c and the deep n-well 146. Electrically isolating the p-wells 144b, 144c permits the p-wells to operate as emitters, bases, or collectors for the illustrated bipolar devices.

The isolation regions 148 can reduce static current leakage between active areas connected to different electrical nodes and can create resistive well paths between active areas. Formation of the isolation regions 148 can involve etching trenches in the substrate 147, filling the trenches with a dielectric, such as silicon dioxide, and removing the excess dielectric using any suitable method, such as chemical-mechanical planarization. Additional details of the isolation regions 148 can be as described above.

Persons having ordinary skill in the art will appreciate that the cross section shown in FIG. 14 can correspond to the equivalent circuit shown in FIG. 15. For example, the first PNP bipolar transistors 170a, 170b can be represented by a first PNP bipolar transistor 170, the second PNP bipolar transistors 171a, 171b can be represented by a second PNP bipolar transistor 171, the third PNP bipolar transistors 172a, 172b can be represented by a third PNP bipolar transistor 172, the fourth PNP bipolar transistors 173a, 173b can be represented by a fourth PNP bipolar transistor 173, and the fifth PNP bipolar transistors 174a, 174b can be represented by a fifth PNP bipolar transistor 174. Similarly, the NPN bipolar transistors 177a, 177b can be represented by an NPN bipolar transistor 177, the first resistors 179a, 179b can be represented by a first resistor 179, the second resistors 180a, 180b can be represented by a second resistor 180, the third resistors 181a, 181b can be represented by a third resistor 181, the fourth resistors 182a, 182b can be represented by a fourth resistor 182, the fifth resistors 183a, 183b can be represented by a fifth resistor 183, the sixth resistors 184a, 184b can be represented by a sixth resistor 184, and the seventh resistors 185a, 185b can be represented by a seventh resistor 185. Furthermore, the P-MOS transistors 178a, 178b can be represented by a P-MOS transistor 178.

With reference to FIG. 15, the emitter of the first PNP bipolar transistor 170 is electrically connected to a first end of the first resistor 179, to the emitter of the second PNP bipolar transistor 171, and to the emitter of the NPN bipolar transistor 177. The collector of the first PNP bipolar transistor 170 is electrically connected to a first end of the second resistor 180. The second resistor 180 further includes a second end electrically connected to the voltage reference $V_1$. The base of the first PNP bipolar transistor 170 is electrically connected to the base of the second PNP bipolar transistor 171 and to a first end of the fourth resistor 182. The collector of the second PNP bipolar transistor 171 is electrically connected to a first end of the third resistor 181. The third resistor 181 further includes a second end electrically connected to the voltage reference $V_1$.

The fourth resistor 182 further includes a second end electrically connected to the collector of the NPN bipolar transistor 177, to the base of the third PNP bipolar transistor 172, to the body of the P-MOS transistor 178, to a first end of the seventh resistor 185, and to the bases of the fourth and fifth PNP transistors 173, 174. The collector of the third PNP bipolar transistor 172 is electrically connected to the drain of the P-MOS transistor 178, to a second end of the first resistor 179, and to the base of the NPN transistor 177. The emitter of the third PNP bipolar transistor 172 is electrically connected to the source and gate of the P-MOS transistor 178, to a second end of the seventh resistor 185, and to the emitters of the fourth and fifth PNP transistors 173, 174 at a node labeled anode.

The collector of the fourth PNP transistor 173 is electrically connected to a first end of the fifth resistor 183. The fifth resistor 183 further includes a second end electrically connected to the voltage reference $V_1$. The collector of the fifth PNP transistor 174 is electrically connected to a first end of the sixth resistor 184. The sixth resistor 184 further includes a second end electrically connected to the voltage reference $V_1$.

Although the P-MOS SCR device is illustrated as including the seventh resistor 185, in an alternative embodiment, the seventh resistor 185 can be very large, (for example, greater than about 1 M-Ohm), or omitted. For example, the n-type active area 143b of FIG. 14 need not be electrically connected to the anode. Persons having ordinary skill in the art will appreciate that the seventh resistor 185 can be selectively tuned and/or included to aid in controlling the reverse breakdown voltage, the trigger voltage and/or the holding voltage of the illustrated SCR device.

The P-MOS SCR device 140 can protect an IC from a transient electrical event having a positive voltage applied to the anode with respect to the cathode. For example, a transient electrical event can cause the voltage of the anode to increase relative to the cathode until the collector-emitter breakdown voltage of NPN bipolar transistor 177 is reached. For a transient electrical event that decreases the voltage of the anode with respect to the voltage of the cathode, the P-MOS SCR device 140 can have a breakdown voltage determined based upon a breakdown between the n-well 141b and each of the p-wells 144a, 144c. However, in contrast to the HRBV devices described earlier, the reverse junction breakdown occurs at a relatively low voltage. Accordingly, the P-MOS SCR device 140 can be combined in a cascade with a HRBV device, such as in for certain high reverse breakdown voltage applications.

While illustrated in the context of a p-type semiconductor substrate, the principles and advantages described herein are also applicable to an n-type configuration where the doping polarities are reversed. For example, an n-type substrate can be provided rather than a p-type substrate, and wells and active areas of an opposite doping type can be provided in the n-type substrate. Persons having ordinary skill in the art will appreciate that in such configurations the operation of the anode and cathode can be reversed. Furthermore, certain implementations described herein can be applicable to undoped substrates, such as substrates used in certain silicon-on-insulator (SOI) technologies.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

APPLICATIONS

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products, including those for industrial, medical and automotive applications.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a semiconductor substrate comprising a first p-well and a second p-well adjacent the first p-well, wherein the first and second p-wells are separated by an n-type region;
a first n-type active area over the first p-well, the first n-type active area electrically connected to a cathode of a first high reverse blocking voltage (HRBV) device;

a first p-type active area over the second p-well, the first p-type active area electrically connected to an anode of the first HRBV device, wherein the first n-type active area, the first p-well and the n-type region are configured to operate as an emitter, a base, and a collector of a NPN bipolar transistor, respectively, and wherein the second p-well, the n-type region, and the first p-well are configured to operate as an emitter, a base, and a collector of a PNP bipolar transistor, respectively, the NPN bipolar transistor defining a forward trigger voltage of the first HRBV device and the PNP bipolar transistor defining a reverse breakdown voltage of the first HRBV device; and a first protection circuit electrically connected between a first pad and a second pad, wherein the first protection circuit comprises the first HRBV device, wherein the first protection circuit is configured to activate to provide protection against a transient electrical event received between the first and second pads when the transient electrical event has a first voltage polarity, and wherein the first HRBV device is configured to prevent the first protection circuit from activating when the transient electrical event has a second voltage polarity opposite the first voltage polarity.

2. The apparatus of claim 1, wherein the semiconductor substrate is p-type and further comprises a deep n-well positioned beneath the first p-well, the second p-well, and the n-type region.

3. The apparatus of claim 2, wherein the deep n-well defines a doping of the n-type region.

4. The apparatus of claim 2, wherein the n-type region comprises an n-well disposed between the first and second p-wells.

5. The apparatus of claim 2, wherein the p-type semiconductor substrate further comprises a third p-well positioned adjacent the first p-well on a side of the first p-well opposite the second p-well, wherein the first and third p-wells are separated by another n-type region, and wherein the deep n-well is further positioned beneath the third p-well and the another n-type region.

6. The apparatus of claim 5, wherein the p-type semiconductor substrate further comprises an n-well surrounding the first, second, and third p-wells, wherein the n-well and deep n-well electrically isolate the first, second, and third p-wells from the p-type semiconductor substrate.

7. The apparatus of claim 6, wherein the p-type semiconductor substrate further comprises a fourth p-well surrounding the n-well for operating as a portion of a guard ring for the first HRBV device, wherein the second p-well, the n-well, and the substrate operate as an emitter, a base, and a collector of a lateral parasitic bipolar transistor, respectively, and wherein the fourth p-well is spaced from the n-well at a distance sufficient such that a breakdown voltage of the lateral parasitic bipolar transistor is higher than a breakdown voltage of the PNP bipolar transistor.

8. The apparatus of claim 7, wherein the n-well and the fourth p-well are separated by a distance ranging between about 0.5 µm to about 2.5 µm.

9. The apparatus of claim 2, wherein the first p-well and the second p-well are separated by a distance ranging between about 1.5 µm to about 6.5 µm.

10. The apparatus of claim 2, further comprising a second p-type active area over the first p-well, the second p-type active area positioned between the n-type region and the first n-type active area.

11. The apparatus of claim 10, further comprising a second n-type active area over the first p-well and the n-type region, the second n-type active area including a first portion disposed over the first p-well and a second portion disposed over the n-type region.

12. The apparatus of claim 11, wherein the n-type region comprises an n-well disposed between the first and second p-wells.

13. The apparatus of claim 2, further comprising a second p-type active area over the first p-well and the n-type region, the second p-type active area including a first portion disposed over the first p-well and a second portion disposed over the n-type region.

14. The apparatus of claim 1, wherein the apparatus further comprises a bonding pad, a forward pad protection circuit, and a reverse pad protection circuit, wherein the first protection circuit comprises one of the forward pad protection circuit or the reverse pad protection circuit, wherein the forward pad protection circuit is electrically connected between the bonding pad and a voltage reference and defines a protection response against the transient electrical event when the transient electrical event has a voltage greater than that of the voltage reference, and wherein the reverse pad protection circuit is electrically connected between the bonding pad and the voltage reference and defines a protection response against the transient electrical event when the transient electrical event has a voltage less than that of the voltage reference.

15. The apparatus of claim 14, wherein the forward protection circuit includes the first HRBV device, wherein the anode of the first HRBV device is electrically connected to the bonding pad and the cathode of the first HRBV device is electrically connected to the voltage reference, wherein the reverse breakdown voltage of the first HRBV device is a high reverse breakdown voltage that prevents the forward protection circuit from activating when the transient electrical event has a voltage less than that of the voltage reference.

16. The apparatus of claim 14, wherein the reverse protection circuit includes the first HRBV device, wherein the cathode of the first HRBV device is electrically connected to the bonding pad and the anode of the first HRBV device is electrically connected to the voltage reference, wherein the reverse breakdown voltage of the first HRBV device is a high reverse breakdown voltage that prevents the reverse protection circuit from activating when the transient electrical event has a voltage greater than that of the voltage reference.

17. The apparatus of claim 16, wherein the forward protection circuit further comprises a second HRBV device, the second HRBV device having an anode and a cathode, and wherein the anode of the second HRBV device is electrically connected to the pad, and wherein the cathode of the first HRBV device is electrically connected to the bonding pad, and wherein a high reverse breakdown voltage of the second HRBV device prevents the forward protection circuit from activating when the transient electrical event has a voltage less than that of the voltage reference.

18. The apparatus of claim 17, wherein the forward protection circuit further comprises a first PNP protection device and a second PNP protection device, wherein the first PNP protection device comprises an emitter and a base electrically connected to a cathode of the second HRBV device, and wherein the second PNP protection device comprises an emitter and a base electrically connected to a collector of the first PNP protection device, and wherein the second PNP protection device further comprises a collector electrically connected to the voltage reference.

19. The apparatus of claim 18, wherein the first PNP protection device comprises a parasitic device of a first P-MOS transistor, and wherein the second PNP protection device comprises a parasitic device of a second P-MOS transistor.

20. The apparatus of claim 16, further comprising a protection device electrically connected in series with either the first HRBV device or the second HRBV device.

21. The apparatus of claim 16, further comprising a plurality of protection devices electrically connected in series with the second HRBV device.

22. The apparatus of claim 16, further comprising a silicon controlled rectifier (SCR) device in the forward protection circuit.

23. An apparatus comprising:
- a semiconductor substrate comprising a first well and a second well adjacent the first well, wherein the first and second wells have a doping of a first type and are separated by a doped region having a doping of a second type opposite the first;
- a first active area over the first well, the first active area having a doping of the second type and electrically connected to a first terminal of a first high reverse blocking voltage (HRBV) device;
- a second active area over the second well, the second active area having a doping of the first type and electrically connected to a second terminal of the first HRBV device, wherein the first active area, the first well and the doped region are configured to operate as an emitter, a base, and a collector of a first bipolar transistor, respectively, and wherein the second well, the doped region, and the first well are configured to operate as an emitter, a base, and a collector of a second bipolar transistor, respectively, the first bipolar transistor defining a forward trigger voltage of the first HRBV device and the second bipolar transistor defining a reverse breakdown voltage of the first HRBV device; and
- a first protection circuit electrically connected between a first pad and a second pad, wherein the first protection circuit comprises the first HRBV device, wherein the first protection circuit is configured to activate to provide protection against a transient electrical event received between the first and second pads when the transient electrical event has a first voltage polarity, and wherein the first HRBV device is configured to prevent the first protection circuit from activating when the transient electrical event has a second voltage polarity opposite the first voltage polarity.

24. The apparatus of claim 23, wherein the first type is p-type, the first terminal of the first HRBV device is a cathode, and the second terminal of the first HRBV device is an anode.

25. The apparatus of claim 24, further comprising a deep n-well positioned beneath the first well, the second well, and the doped region.

26. The apparatus of claim 1, wherein the first HRBV device has a reverse breakdown voltage larger than about 45 volts.

27. The apparatus of claim 23, wherein the first HRBV device has a reverse breakdown voltage larger than about 45 volts.

* * * * *